(12) United States Patent
Takahashi et al.

(10) Patent No.: US 7,241,551 B2
(45) Date of Patent: Jul. 10, 2007

(54) POSITIVE-WORKING RESIST COMPOSITION

(75) Inventors: Hyou Takahashi, Shizuoka (JP); Tsukasa Yamanaka, Shizuoka (JP); Toru Fujimori, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/863,347

(22) Filed: Jun. 9, 2004

(65) Prior Publication Data

US 2004/0248035 A1    Dec. 9, 2004

(30) Foreign Application Priority Data

Jun. 9, 2003    (JP) ............... P.2003-163959

(51) Int. Cl.
*G03F 7/004* (2006.01)
(52) U.S. Cl. .................... 430/270.1; 568/341
(58) Field of Classification Search ............. 430/270.1; 568/341
See application file for complete search history.

(56) References Cited

U.S. PATENT DOCUMENTS 3,932,510 A * 1/1976 Muller ............... 568/341
4,632,899 A * 12/1986 Takeda ............... 430/292
5,352,551 A * 10/1994 Mizuguchi et al. ...... 430/17

FOREIGN PATENT DOCUMENTS

| EP | 1260864 | * | 11/2002 |
| JP | 6-130665 | A | 5/1994 |
| JP | 2002-148784 | A | 5/2002 |

* cited by examiner

*Primary Examiner*—Amanda Walke
(74) *Attorney, Agent, or Firm*—Sughrue Mion, PLLC

(57) ABSTRACT

A positive-working resist composition comprising (A) a resin that increases solubility in an alkali developing solution by the action of an acid, (B) a compound which generates an acid upon irradiation of an actinic ray or radiation, (C) a nonionic cyclic compound having at least one partial structure represented by the following formula (I) or (II) and at least having either a melting point of 35° C. or more or a boiling point of 100° C./10 mmHg or more:

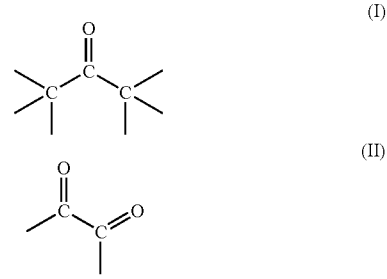

and (D) a solvent.

11 Claims, No Drawings

POSITIVE-WORKING RESIST COMPOSITION

FIELD OF THE INVENTION

The present invention relates to a positive-working resist composition used in the production process of semiconductor devices, for example, IC, in the production of circuit substrates for liquid crystals or thermal heads and in other photofabrication processes. More specifically, the present invention pertains to a positive-working resist composition suitable for using a far ultraviolet ray of not more than 250 nm as a light source for exposure.

BACKGROUND OF THE INVENTION

A chemically amplified positive-working resist composition is a pattern formation material in which an acid is generated in the exposed area upon irradiation of radiation, for example, a far ultraviolet ray, and solubility in a developer between the exposed area and unexposed area is differentiated by a reaction using the acid as a catalyst, whereby a pattern is formed on a substrate.

As to chemically amplified resist compositions, a resist composition containing as a solvent a compound having a carbonyl group is described in Patent Literature 1 (JP-A-6-130665 (the term "JP-A" as used herein means an "unexamined published Japanese patent application")), and 2 a resist composition containing octanone as an additive is described in Patent Literature 2 (JP-A-2002-148784).

Such conventional resist compositions, however, involve the problem that, in forming a fine pattern, there arises a pattern collapse, leading to insufficient image properties.

Patent Literature 1: JP-A-6-130665

Patent Literature 2: JP-A-2002-148784

SUMMARY OF THE INVENTION

An object of the present invention is to provide a positive-working resist composition that prevents pattern collapse in forming a fine pattern.

Another object of the invention is to provide a positive-working resist composition showing improved PED stability, improved line edge roughness, improved profile, improved sensitivity and improved resolution.

Other objects of the invention will become apparent from the following description.

The above-described objects of the invention are accomplished by the following constitution.

(1) A positive-working resist composition comprising (A) a resin that increases solubility in an alkali developing solution by the action of an acid, (B) a compound which generates an acid upon irradiation of an actinic ray or radiation, (C) a nonionic cyclic compound having at least one partial structure represented by the following formula (I) or (II) and at least having either a melting point of 35° C. or more or a boiling point of 100° C./10 mmHg or more:

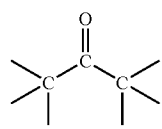

(I)

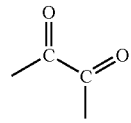

(II)

and (D) a solvent.

(2) The positive-working resist composition as described in (1) above, wherein the component (C) of the nonionic cyclic compound has an alicyclic structure or a bridged alicyclic structure, and at least one ring constituting the alicyclic structure or bridged alicyclic structure has at least one partial structure represented by the formula (I) or (II).

(3) The positive-working resist composition as described in (2) above, wherein the (C) component of the nonionic cyclic compound has a bridged alicyclic structure and does not have a benzene ring.

(4) The positive-working resist composition as described in any one of (1) to (3) above, wherein the nonionic cyclic compound of the component (C) has two or more partial structures represented by the formula (I) or at least one partial structure represented by the above formula (II) and does not have a benzene ring.

(5) The positive-working resist composition as described in any one of (1) to (4) above, which further comprises (E) a nitrogen-containing basic compound.

DETAILED DESCRIPTION OF THE INVENTION

The invention also includes the following preferred embodiments.

(6) The positive-working resist composition as described in any one of (1) to (5), wherein atoms constituting the nonionic cyclic compound of the component (C) comprise only carbon atoms and hydrogen atoms except for the partial structure represented by the formula (I) or (II).

(7) The positive-working resist composition as described in any one of (1) to (6), wherein the resin of the component (A) has an alicyclic structure or a bridged alicyclic structure.

(8) The positive-working resist composition as described in (7), wherein the resin of the component (A) is a resin having an alkali-soluble group protected with a 2-alkyl-2-adamantyl group or a 1-adamantyl-1-alkylalkyl group.

(9) The positive-working resist composition as described in (7) or (8), wherein the resin of the component (A) further has a repeating unit represented by the following formula (III):

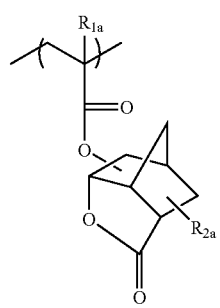

(III)

In the formula (III), $R_{1a}$ represents a hydrogen atom, an alkyl group or a halogen atom, and $R_{2a}$ represents a hydrogen atom or an alkyl group.

(10) The positive-working resist composition as described in any one of (7) to (9), wherein at least one of the bridged alicyclic structures in the resin of the component (A) is dihydroxyadamantane.

The invention is described in detail below.

With respect to the description of a group (atomic group) in the specification, the term "group" which is not referred to whether it is substituted or not means and includes both unsubstituted and substituted groups. For example, "an alkyl group" includes not only an alkyl group having no substituents (unsubstituted alkyl group) but also an alkyl group having a substituent (substituted alkyl group).

[1] Resin that Increases Solubility in an Alkali Developing Solution by the Action of an Acid (Component (A))

The positive-working resist composition of the invention contains a resin that increases solubility in an alkali developing solution by the action of an acid.

In the case of irradiating the positive-working resist composition of the invention by an ArF excimer laser, the resin that increases solubility in an alkali developing solution by the action of an acid is preferably a resin which has an alicyclic structure or a bridged alicyclic structure and which increases solubility in an alkali developing solution by the action of an acid (hereinafter also referred to as "acid-decomposable resin").

As the acid-decomposable resin, a resin which has a repeating unit having a partial structure containing an alicyclic hydrocarbon represented, for example, by any one of the following formulae (pI) to (pVI) and which increases solubility in an alkali developing solution by the action of an acid is preferred.

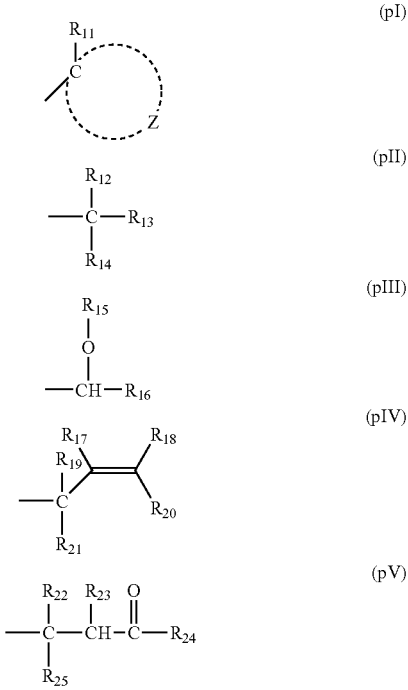

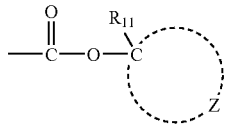

In the above formulae, $R_{11}$ represents a methyl group, an ethyl group, a n-propyl group, an isopropyl group, a n-butyl group, an isobutyl group or a sec-butyl group, and Z represents an atomic group necessary for forming an alicyclic hydrocarbon group together with the carbon atom.

$R_{12}$ to $R_{16}$ each independently represents a straight or branched alkyl group having 1 to 4 carbon atoms or an alicyclic hydrocarbon group, provided that at least one of $R_{12}$ to $R_{14}$ or either $R_{15}$ or $R_{16}$ represents an alicyclic hydrocarbon group.

$R_{17}$ to $R_{21}$ each independently represents a hydrogen atom, a straight or branched alkyl group having 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight or branched alkyl group having 1 to 4 carbon atoms or an alicyclic hydrocarbon group.

$R_{22}$ to $R_{25}$ each independently represents a hydrogen atom, a straight or branched alkyl group having 1 to 4 carbon atoms or an alicyclic hydrocarbon group, provided that at least one of $R_{22}$ to $R_{25}$ represents an alicyclic hydrocarbon group. Also, $R_{23}$ and $R_{24}$ may be connected to each other to form a ring.

In the general formulae (pI) to (pVI), the alkyl group in $R_{12}$ to $R_{25}$ represents a straight or branched alkyl group having 1 to 4 carbon atoms, which may be either substituted or unsubstituted. Examples of the alkyl group include a methyl group, an ethyl group, a n-propyl group, an isopropyl group, a n-butyl group, an isobutyl group, a sec-butyl group and a t-butyl group.

Also, as a substituent for the alkyl group, there may be illustrated an alkoxy group having 1 to 4 carbon atoms, a halogen atom (a fluorine atom, a chlorine atom, a bromine atom or an iodine atom), an acyl group, an acyloxy group, a cyano group, a hydroxyl group, a carboxy group, an alkoxycarbonyl group and a nitro group.

The alicyclic hydrocarbon group in $R_{11}$ to $R_{25}$ or the alicyclic hydrocarbon group formed by both Z and the carbon atom may be monocyclic or polycyclic. Specific examples thereof include groups having a monocyclic, bicyclic, tricyclic or tetracyclic structure having 5 or more carbon atoms. The number of carbon atoms included is preferably 6 to 30, particularly preferably 7 to 25. The alicyclic hydrocarbon group may have a substituent.

Examples of the alicyclic moiety of the alicyclic hydrocarbon group are illustrated below.

-continued
(3)
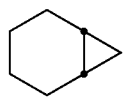
(4)
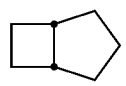
(5)
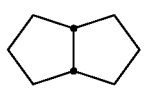
(6)
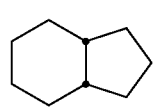
(7)
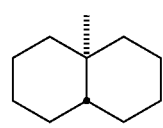
(8)
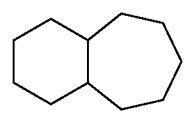
(9)
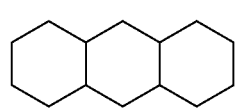
(10)
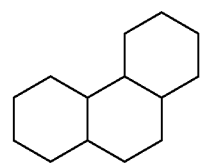
(11)
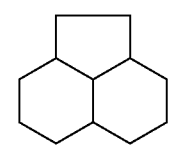
(12)
(13)
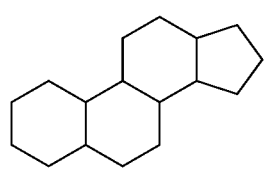
(14)
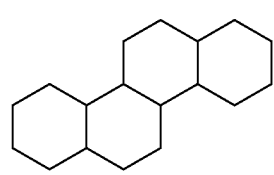
-continued
(15)
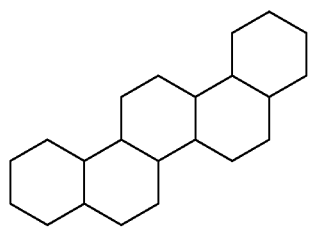
(16)
(17)
(18)
(19)
(20)
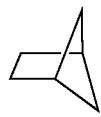
(21)
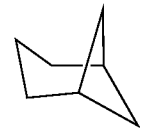
(22)
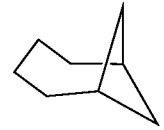
(23)
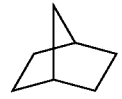
(24)
(25)
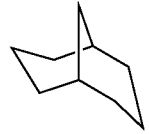
(26)
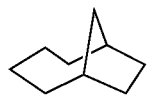

(27) 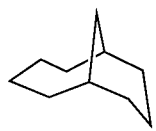
(28) 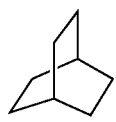
(29) 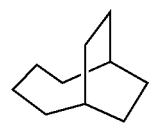
(30) 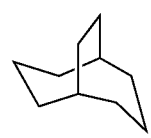
(31) 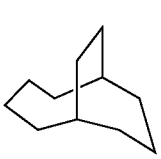
(32) 
(33) 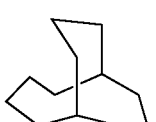
(34) 
(35) 
(36) 
(37) 
(38) 
(39) 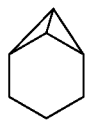
(40) 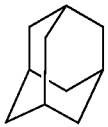
(41) 
(42) 
(43) 
(44) 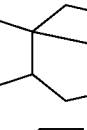
(45) 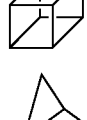
(46) 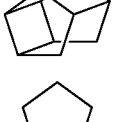
(47) 
(48) 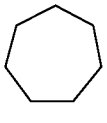
(49) 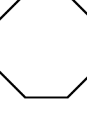
(50) 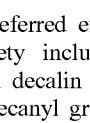
In the invention, preferred examples of the above-described alicyclic moiety include an adamantly group, noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a dyclododecanyl group. More preferred are an adamantly group, a decalin residue, a norbornyl group, a cedrol group, a cyclohexyl group, a cycloheptyl group, a cyclooctyl group, a cyclodecanyl group and a cyclododecanyl group.

Examples of the substituent for the alicyclic hydrocarbon group include an alkyl group, a substituted alkyl group, a halogen atom, a hydroxyl group, an alkoxy group, a carboxyl group and an alkoxycarbonyl group. As the alkyl group, a lower alkyl group such as methyl, ethyl, propyl, isopropyl or butyl group is preferred. More preferred is the substituent selected from methyl, ethyl, propyl and isopropyl groups. As a substituent for the substituted alkyl group, there may be illustrated a hydroxyl group, a halogen atom and an alkoxy group. Examples of the alkoxy group include an alkoxy group having 1 to 4 carbon atoms, such as methoxy, ethoxy, propoxy or butoxy group.

The structure represented by any one of formulae (pI) to (pVI) in the above resin can be used for protecting an alkali-soluble group. Examples of the alkali-soluble group include various alkali-soluble groups known in the field of art.

Specific examples thereof include a carboxylic acid group, a sulfonic acid group, a phenol group and a thiol group, and a carboxylic acid group and a sulfonic acid group are preferred.

Preferred examples of the alkali-soluble group protected with the structure represented by any one of formulae (pI) to (PVI) in the above resin include those groups represented by the following formulae (pVII) to (pXI).

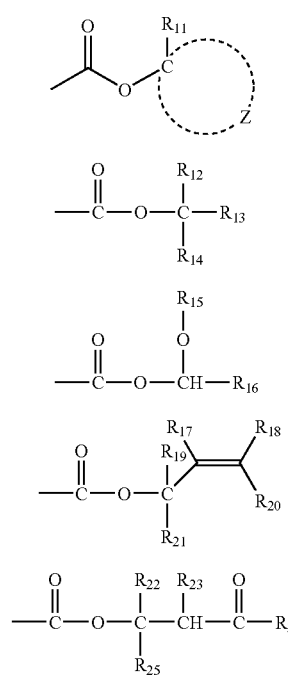

In the above formulae, $R_{11}$ to $R_{25}$ and Z have the same meanings as defined hereinbefore.

In the above resin, preferred examples of the repeating unit having the alkali-soluble group protected by the structure represented by any one of formulae (pI) to (pVI) include a repeating unit represented by the following formula (pA).

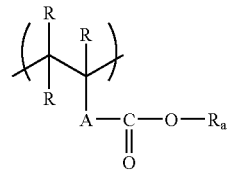

In the above formula, R represents a hydrogen atom, a halogen atom or a substituted or unsubstituted, straight or branched alkyl group having 1 to 4 carbon atoms. A plurality of Rs may be the same or different from each other.

A represents an individual group or a combination of two or more groups selected from a single bond, an alkylene group, a substituted alkylene group, an ether group, a thioether group, a carbonyl group, an ester group, an amido group, a sulfonamido group, a urethane group and a urea group.

$R_a$ represents one of the groups represented by the above formulae (pI) to (pVI).

Specific examples of the monomer corresponding to the repeating unit represented by formula (pA) are illustrated below.

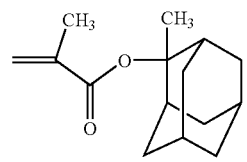

1

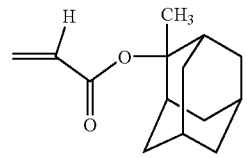

2

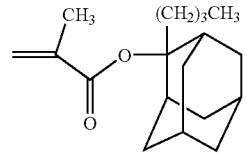

3

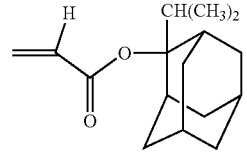

4

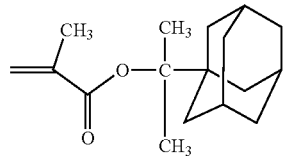

5

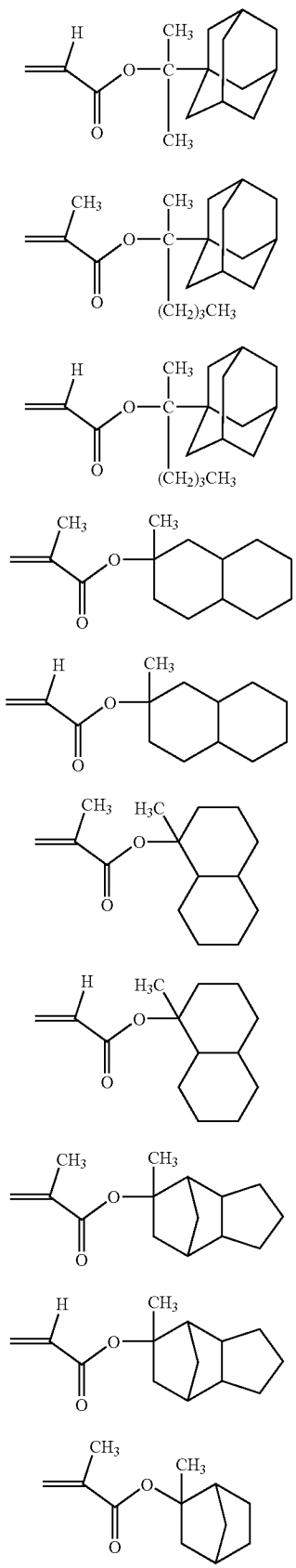

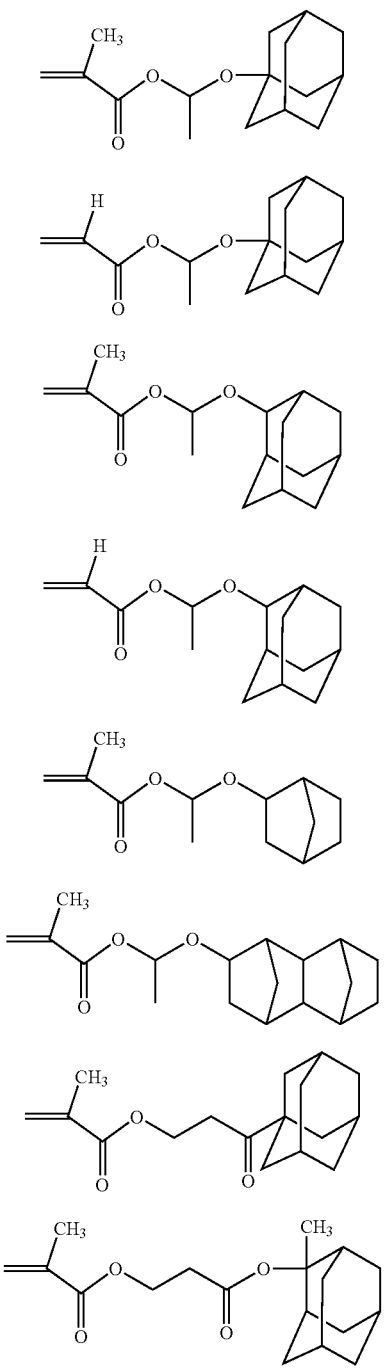

The acid-decomposable resin preferably has a repeating unit having an alkali-soluble group protected with a 2-alkyl-2-adamantyl group such as a repeating unit formed by any one of the above-described monomers 1 to 4 and 32.

The acid-decomposable resin preferably has a repeating unit having an alkali-soluble group protected with a 1-adamantyl-1-alkylalkyl group such as a repeating unit formed by any one of the above-described monomers 5 to 8.

The resin in accordance with the invention has a group which is insoluble or slightly soluble in alkali and can be decomposed by the action of an acid to become alkali-soluble (hereinafter, also referred to as "acid-decomposable group").

The acid-decomposable group can be incorporated into at least one of a repeating unit having the partial structure containing the alicyclic hydrocarbon represented by any one of formulae (pI) to (pVI) and a repeating unit of copolymerization component described hereinafter.

The structure of the acid-decomposable group is represented by —C(=O)—$X_1$—$R_0$.

In the formula, examples of $R_0$ include a tertiary alkyl group such as tert-butyl or tert-amyl, a 1-alkoxyethyl group such as isobornyl, 1-ethoxyethyl, 1-butyoxyethyl, 1-isobutoxyethyl or 1-cyclohexyloxyethyl, an alkoxymethyl group such as 1-methoxymethyl or 1-ethoxymethyl, a 3-oxoalkyl group, a tetrahydropyranyl group, a tetrahydrofuranyl group, a trialkylsilyl ester group, a 3-oxocyclohexyl ester group, a 2-methyl-2-adamantyl group and a mevalonic lactone residue. $X_1$ represents an oxygen atom, a sulfur atom, —NH—, —$NHSO_2$— or —$NHSO_2NH$—.

The acid-decomposable resin preferably has a repeating unit represented by the following formula (AI).

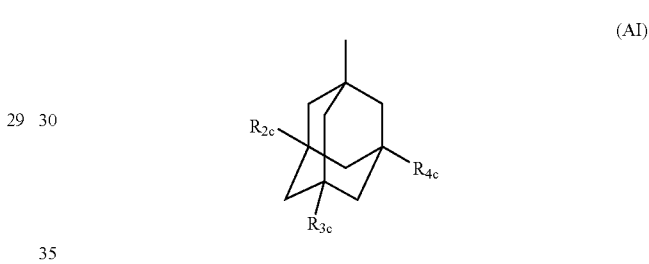

In formula (AI), $R_{2c}$ to $R_{4c}$ each independently represents a hydrogen atom or a hydroxyl group, provided that at least one of $R_{2c}$ to $R_{4c}$ represents a hydroxyl group.

The group represented by the formula (AI) is preferably a dihydroxy-substituted group or a monohydroxy-substituted group, and more preferably a dihydroxy-substituted group.

Examples of the repeating unit having the group represented by formula (AI) include repeating units represented by the following formula (AII).

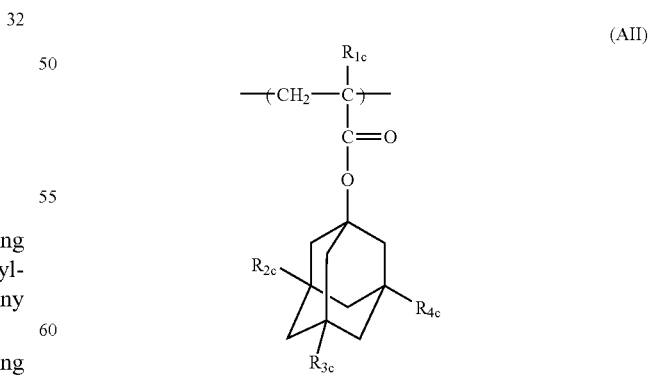

In formula (AII), $R_{1c}$ represents a hydrogen atom or a methyl group. $R_{2c}$ to $R_{4c}$ each independently represents a hydrogen atom or a hydroxyl group, provided that at least one of $R_{2c}$ to $R_{4c}$ represents a hydroxyl group.

Specific examples of the group represented by formula (AII) are illustrated below, however, the invention should not be construed as being limited thereto.

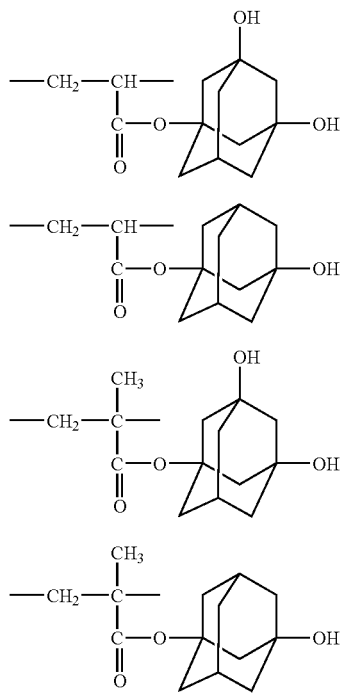

The acid-decomposable resin can further have a repeating unit having a lactone structure represented by the following formula (IV):

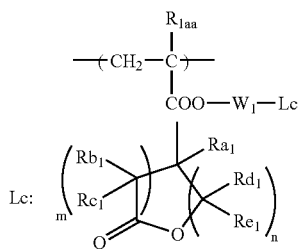

In formula (IV), $R_{1aa}$ represents a hydrogen atom or a methyl group. $W_1$ represents an individual group or a combination of two or more groups selected from a single bond, an alkylene group, an ether group, a thioether group, a carbonyl group and an ester group.

$Ra_1$, $Rb_1$, $Rc_1$, $Rd_1$ and $Re_1$ each independently represents a hydrogen atom or an alkyl group having 1 to 4 carbon atoms, and m and n each independently represents an integer of 0 to 3, provided that m+n is 2 to 6.

Examples of the alkyl group having 1 to 4 carbon atoms for $Ra_1$ to $Re_1$ include a methyl group, an ethyl group, a propyl group, an isopropyl group, a n-butyl group, an isobutyl group, a sec-butyl group and a tert-butyl group.

In formula (IV), examples of the alkylene group represented by $W_1$ include groups represented by the following formula:

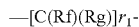

In the above formula, Rf and Rg, which may be the same or different, each represents a hydrogen atom, an alkyl group, a substituted alkyl group, a halogen atom, a hydroxyl group or an alkoxy group. Preferred examples of the alkyl group include a lower alkyl group such as methyl, ethyl, propyl, isopropyl and butyl groups. More preferred examples thereof include methyl, ethyl, propyl and isopropyl groups. Examples of the substituent for the substituted alkyl group include a hydroxyl group, a halogen atom and an alkoxy group. Examples of the alkoxy group include an alkoxy group have 1 to 4 carbon atoms, such as methoxy, ethoxy, propoxy and butoxy groups. Examples of the halogen atom include chlorine, bromine, fluorine and iodine atoms. $r_1$ represents an integer of 1 to 10.

Examples of the substituent in the alkyl group include a carboxyl group, an acyloxy group, a cyano group, an alkyl group, a substituted alkyl group, a halogen atom, a hydroxyl group, an alkoxy group, a substituted alkoxy group, an acetylamido group, an alkoxycarbonyl group and an acyl group.

Examples of the alkyl group include a lower alkyl group such as methyl, ethyl, propyl, isopropyl, butyl, cyclopropyl, cyclobutyl and cyclopentyl groups. Examples of the substituent in the substituted alkyl group include a hydroxyl group, a halogen atom and an alkoxy group. Examples of the substituent in the substituted alkoxy group include, for example, an alkoxy group. Examples of the alkoxy group include an alkoxy group having 1 to 4 carbon atoms, such as methoxy, ethoxy, propoxy and butoxy groups. Examples of the acyloxy group include, for example, an acetoxy group. Examples of the halogen atom include a chlorine atom, a bromine atom, a fluorine atom and an iodine atom.

Specific examples of the repeating unit represented by formula (IV) are illustrated below, however, the invention should not be construed as being limited thereto.

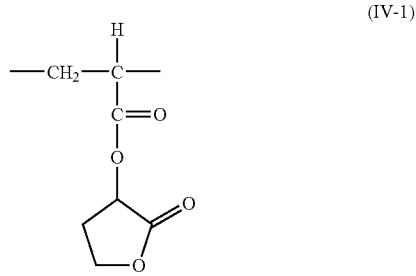

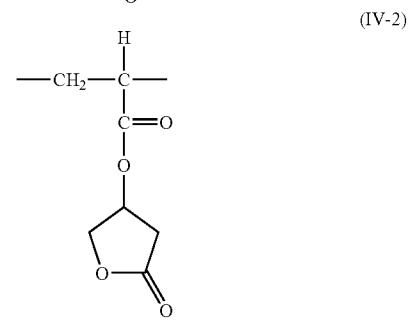

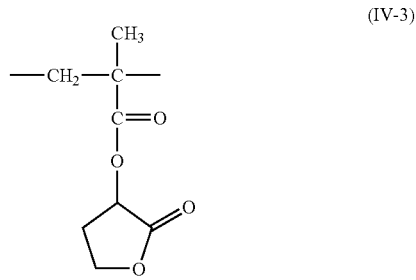

-continued
(IV-4) 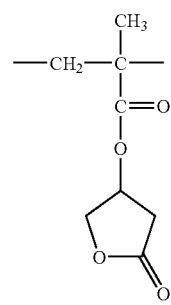
(IV-5) 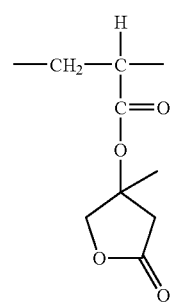
(IV-6) 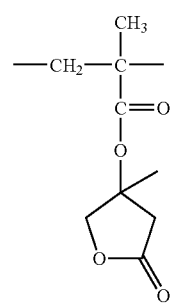
(IV-7) 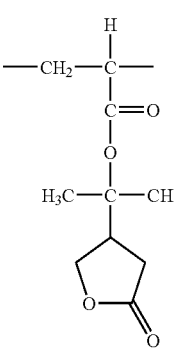
(IV-8) 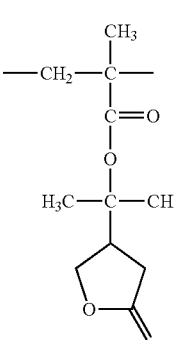
(IV-9) 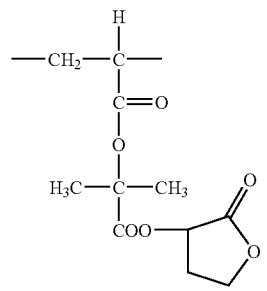
(IV-10) 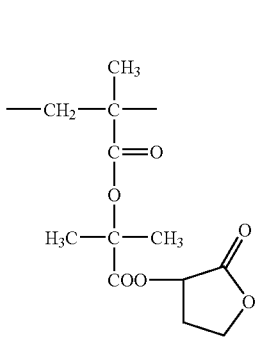
(IV-11) 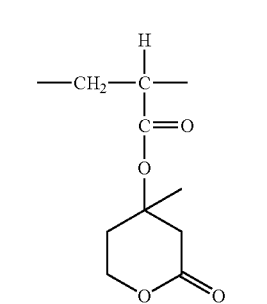
(IV-12) 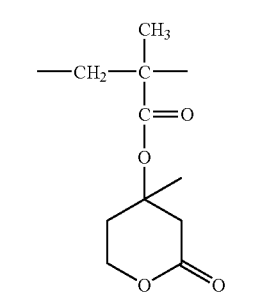
(IV-13) 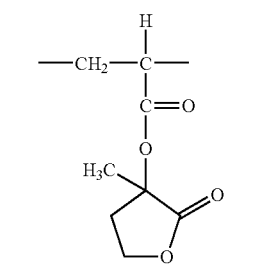

-continued
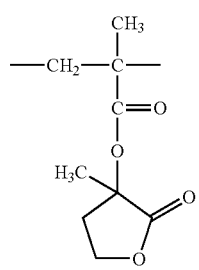 (IV-14)
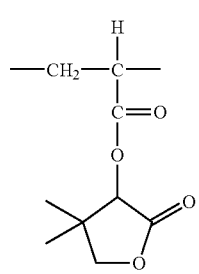 (IV-15)
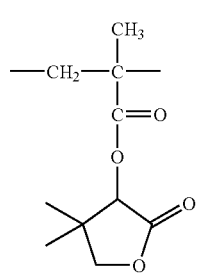 (IV-16)
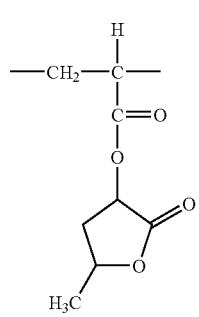 (IV-17)
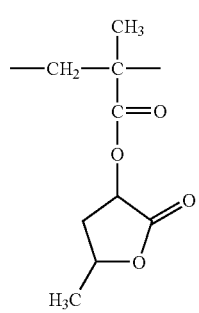 (IV-18)
-continued
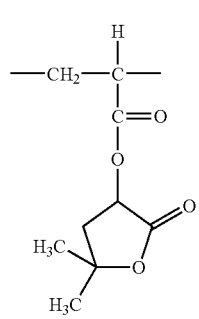 (IV-19)
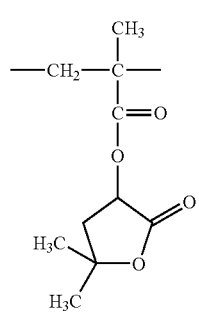 (IV-20)
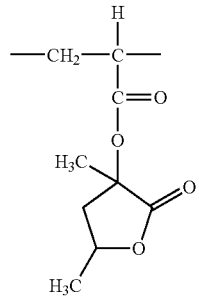 (IV-21)
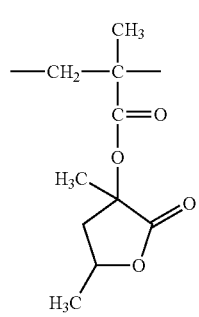 (IV-22)
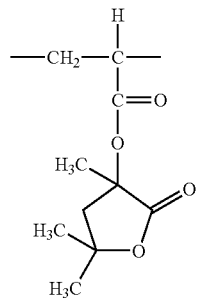 (IV-23)

-continued
(IV-24)
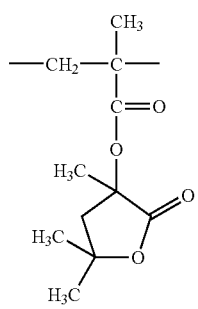
(IV-25)
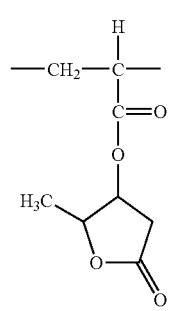
(IV-26)
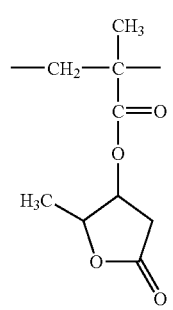
(IV-27)
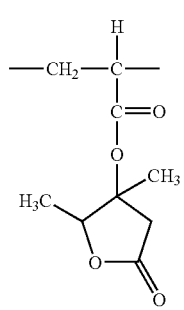
(IV-28)
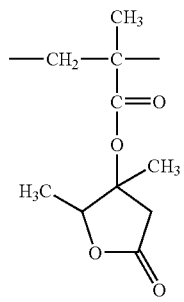
-continued
(IV-29)
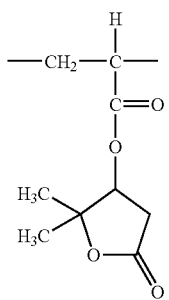
(IV-30)
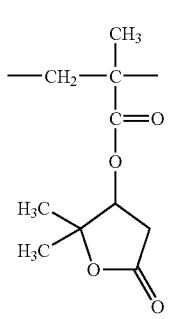
(IV-31)
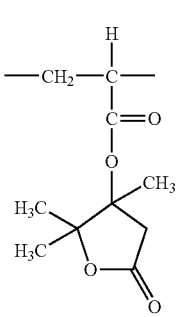
(IV-32)
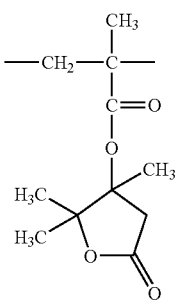
(IV-33)
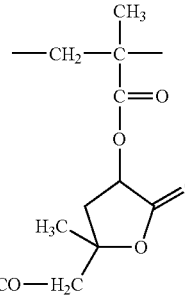

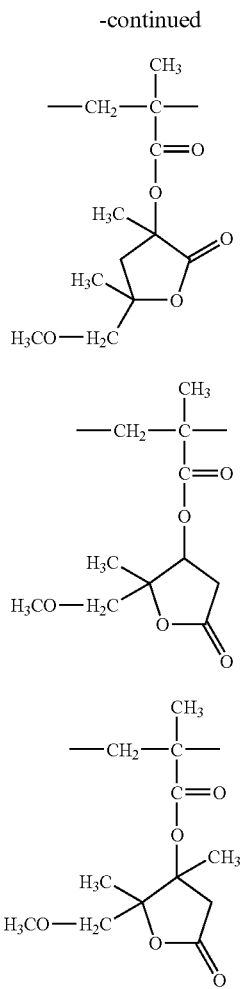

(IV-34)

(IV-35)

(IV-36)

Of the specific examples of repeating unit represented by formula (IV), (IV-17) to (IV-36) are preferred in the point that they provide better exposure margin.

As to the structure of repeating unit represented by formula (IV), the repeating unit having an acrylate structure is preferred in the point that it results in a good edge roughness.

Also, the resin may contain a repeating unit represented by any one of the following formulae (V-1) to (V-4).

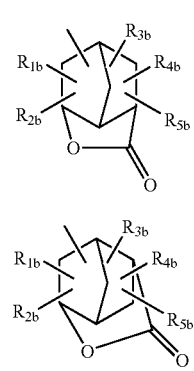

(V-1)

(V-2)

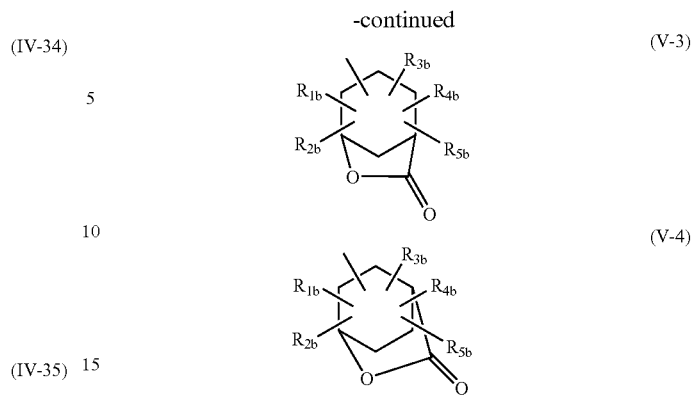

(V-3)

(V-4)

In formulae (V-1) to (V-4), $R_{1b}$ to $R_{5b}$ each independently represents a hydrogen atom, an alkyl, cycloalkyl or alkenyl group which may have a substituent. Two of $R_{1b}$ to $R_{5b}$ may be connected to each other to form a ring.

Examples of the alkyl group in $R_{1b}$ to $R_{5b}$ in formulae (V-1) to (V-4) include a straight alkyl group and a branched alkyl group, which may have a substituent.

As the straight or branched alkyl group, a straight or branched alkyl group having 1 to 12 carbon atoms is preferred, a straight or branched alkyl group having 1 to 10 carbon atoms is more preferred, and methyl, ethyl, propyl, isopropyl, n-butyl, isobutyl, sec-butyl, tert-butyl, pentyl, hexyl, heptyl, octyl, nonyl and decyl groups are still more preferred.

Preferred examples of the cycloalkyl group in $R_{1b}$ to $R_{5b}$ include a cycloalkyl group having 3 to 8 carbon atoms such as cyclopropyl, cyclopentyl, cyclohexyl, cycloheptyl and cyclooctyl groups.

Preferred examples of the alkenyl group in $R_{1b}$ to $R_{5b}$ include an alkenyl group having 2 to 6 carbon atoms such as vinyl, propenyl, butenyl and hexenyl groups.

Also, examples of the ring formed by two of $R_{1b}$ to $R_{5b}$ connected to each other include 3- to 8-membered rings such as a cyclopropane ring, a cyclobutane ring, a cyclopentane ring, a cyclohexane ring and a cyclooctane ring.

$R_{1b}$ to $R_{5b}$ in formulae (V-1) to (V-4) may be connected to any carbon atom that constitutes the cyclic skeleton.

Also, preferred examples of the substituent for the alkyl group, cycloalkyl group and alkenyl group include an alkoxy group having 1 to 4 carbon atoms, a halogen atom (fluorine, chlorine, bromine or iodine atom), an acyl group having 2 to 5 carbon atoms, an acyloxy group having 2 to 5 carbon atoms, a cyano group, a hydroxyl group, a carboxy group, an alkoxycarbonyl group having 2 to 5 carbon atoms and a nitro group.

Examples of the repeating unit having a group represented by any one of formulae (V-1) to (V-4) include a repeating unit represented by formula (V) below.

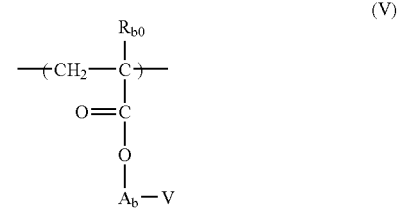

(V)

In formula (V), $R_{b0}$ represents a hydrogen atom, a halogen atom or a substituted or unsubstituted alkyl group having 1 to 4 carbon atoms. Preferred examples of the substituent for the alkyl group of $R_{b0}$ include those described for the preferred examples of the substituent for the alkyl group represented by $R_{1b}$ in formulae (V-1) to (V-4).

Examples of the halogen atom of $R_{b0}$ include a fluorine atom, a chlorine atom, a bromine atom and an iodine atom. $R_{b0}$ preferably represents a hydrogen atom.

$A_b$ represents a single bond, an ether group, an ester group, a carbonyl group, an alkylene group or a divalent group of a combination thereof.

V represents a group represented by any one of formulae (V-1) to (V-4).

In $A_b$, examples of the divalent group of the combination include those represented by the following formula.

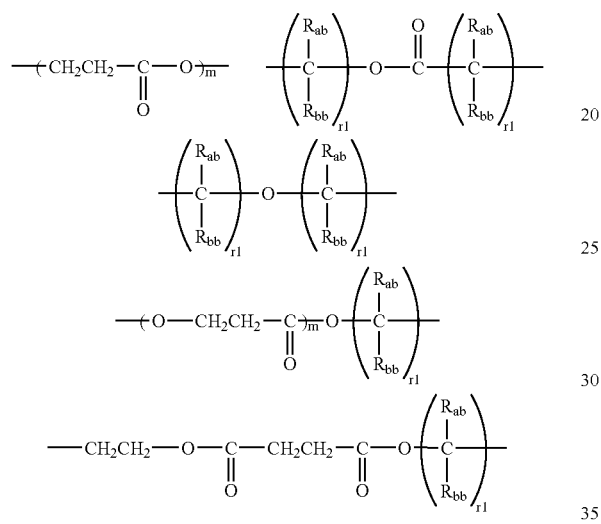

In the above formulae, $R_{ab}$ and $R_{bb}$, which may be the same or different, each represents a hydrogen atom, an alkyl group, a substituted alkyl group, a halogen atom, a hydroxyl group or an alkoxy group.

Preferred examples of the alkyl group include a lower alkyl group such as methyl, ethyl, propyl, isopropyl and butyl, and more preferably, methyl, ethyl, propyl and isopropyl groups. Examples of the substituent for the substituted alkyl group include a hydroxyl group, a halogen atom and an alkoxy group having 1 to 4 carbon atoms.

Examples of the alkoxy group include an alkoxy group having 1 to 4 carbon atoms such as methoxy, ethoxy, propoxy and butoxy groups. Examples of the halogen atom include a chlorine atom, a bromine atom, a fluorine atom and an iodine atom. r1 represents an integer of 1 to 10, preferably 1 to 4. m represents an integer of 1 to 3, preferably 1 or 2.

Specific examples of the repeating unit represented by formula (V) are illustrated below, however, the invention should not be construed as being limited thereto.

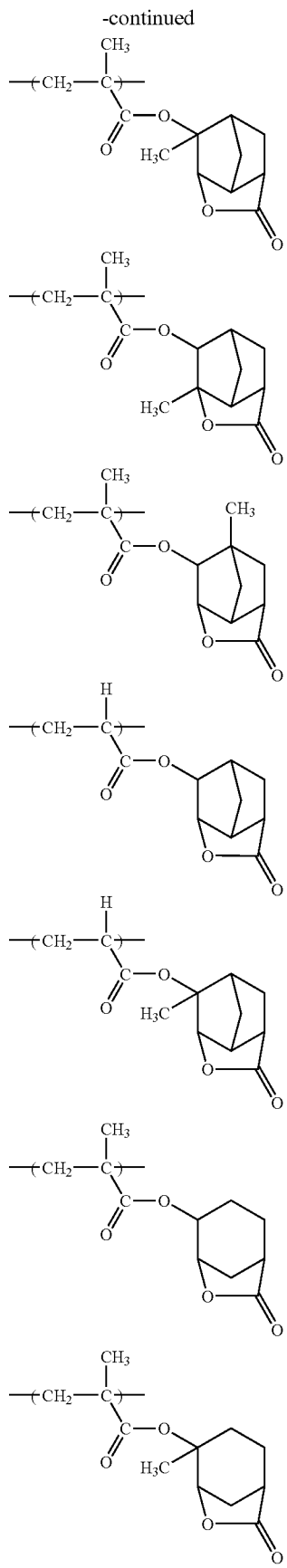

-continued
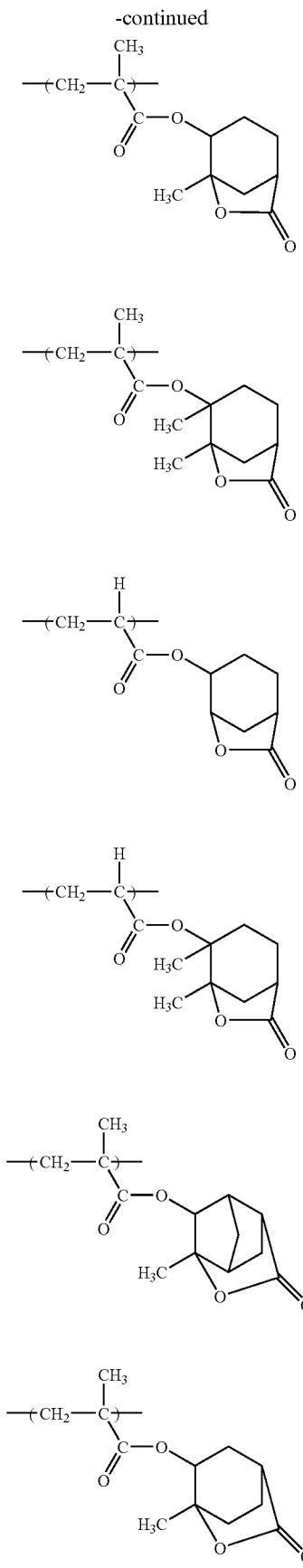
-continued
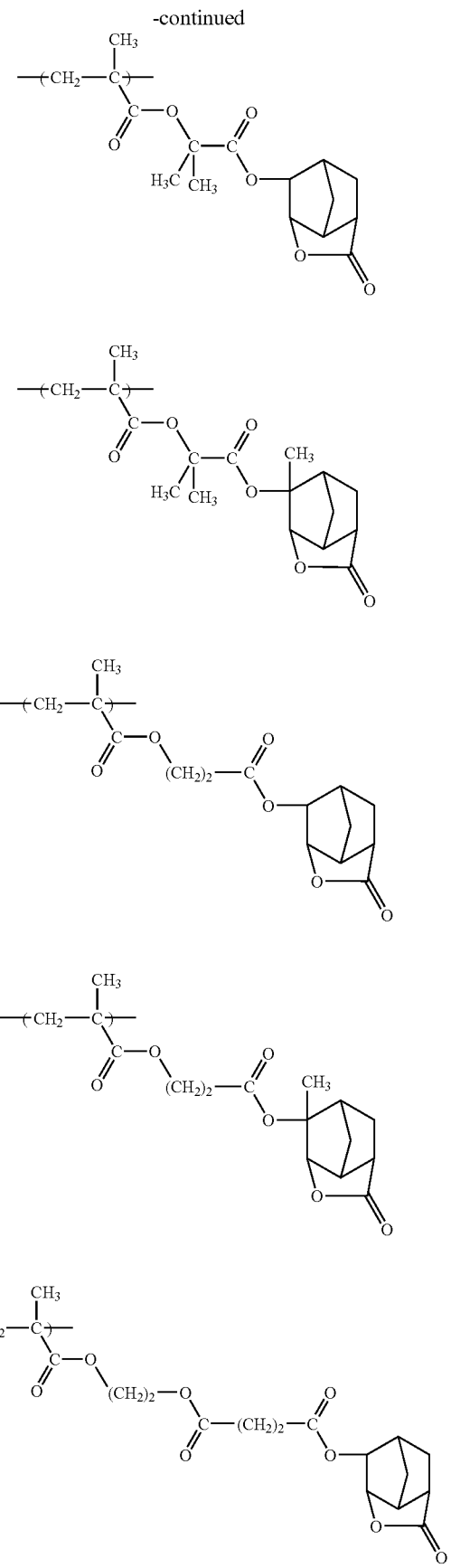

-continued
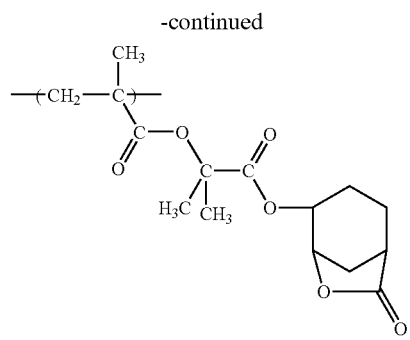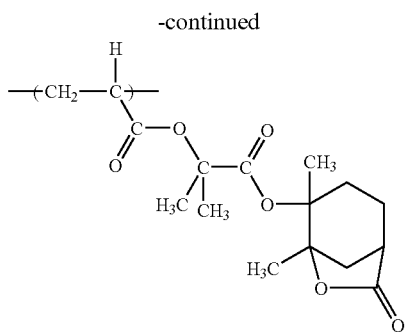
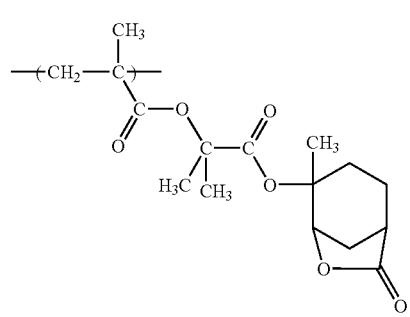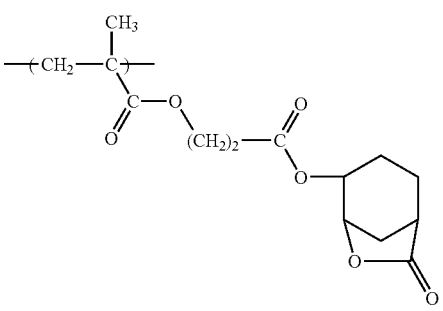
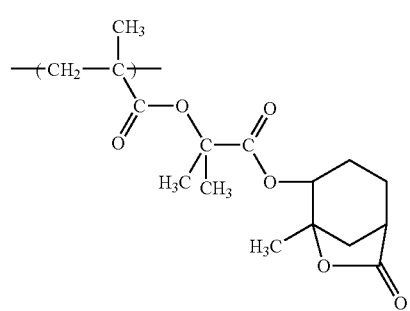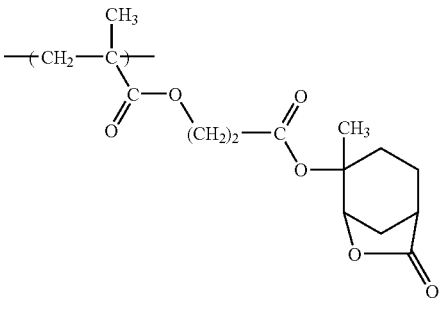
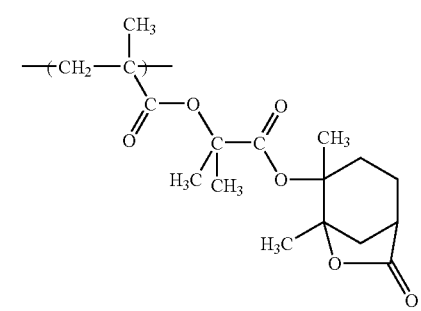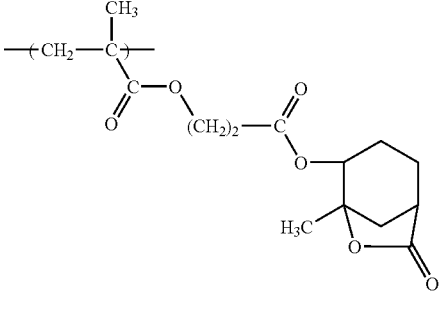
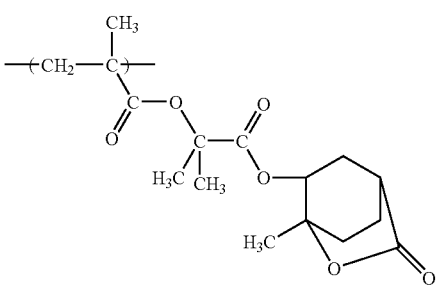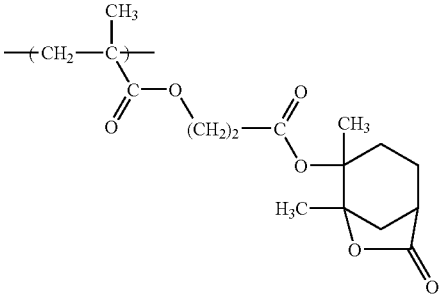

-continued

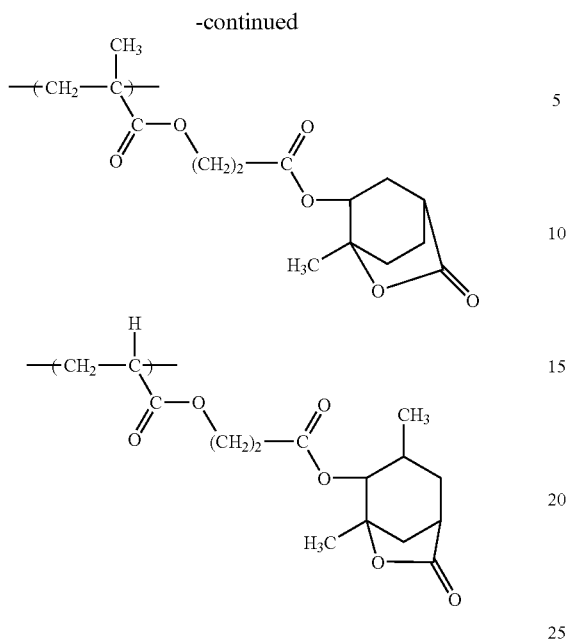

The acid-decomposable resin of the invention preferably has a repeating unit represented by formula (III) below.

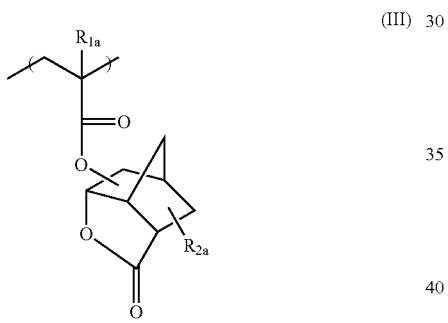

In formula (III), $R_{1a}$ represents a hydrogen atom, an alkyl group or a halogen atom. $R_{2a}$ represents a hydrogen atom or an alkyl group.

The alkyl group of $R_{1a}$ or $R_{2a}$ is preferably a straight or branched alkyl group having 1 to 5 carbon atoms. Examples thereof include methyl, ethyl, propyl, n-butyl, sec-butyl and tert-butyl groups.

The alkyl group of $R_{1a}$ or $R_{2a}$ may be substituted, for example, with a halogen atom (preferably, a fluorine atom).

Examples of the halogen atom for $R_{1a}$ include fluorine, chlorine, bromine and iodine atoms.

Specific examples of the repeating unit represented by formula (III) include the following repeating units.

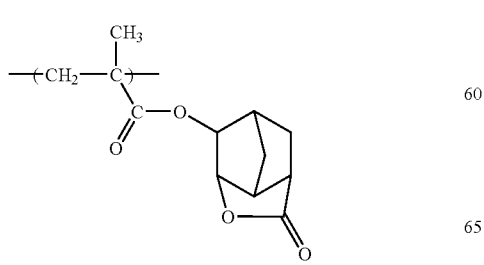

-continued

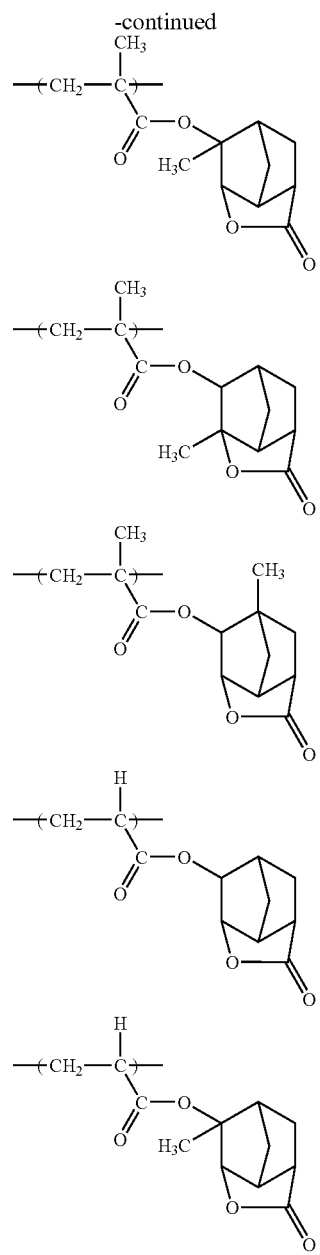

Also, the acid-decomposable resin of the invention may further have a repeating unit represented by formula (VI) below.

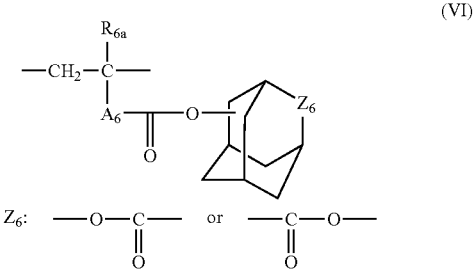

In formula (VI), $A_6$ represents an individual group or a combination of two or more groups selected from a single bond, an alkylene group, a cycloalkylene group, an ether group, a thioether group, a carbonyl group and an ester group.

$R_{6a}$ represents a hydrogen atom, an alkyl group having 1 to 4 carbon atoms, a cyano group or a halogen atom.

In the formula (VI), examples of the alkylene group represented by $A_6$ include groups represented by the following formula:

—[C(Rnf)(Rng)]$_r$-

In the above formula, Rnf and Rng, which may be the same or different, each represents a hydrogen atom, an alkyl group, a substituted alkyl group, a halogen atom, a hydroxyl group or an alkoxy group. Preferred examples of the alkyl group include a lower alkyl group such as methyl, ethyl, propyl, isopropyl and butyl groups. More preferred examples include methyl, ethyl, propyl and isopropyl groups. Examples of the substituent for the substituted alkyl group include a hydroxyl group, a halogen atom and an alkoxy group. Examples of the alkoxy group include an alkoxy group having 1 to 4 carbon atoms such as methoxy, ethoxy, propoxy and butoxy groups. Examples of the halogen atom include chlorine, bromine, fluorine and iodine atoms. r represents an integer of 1 to 10.

In formula (VI), examples of the cycloalkylene group represented by $A_6$ include a cycloalkylene group having 3 to 10 carbon atoms such as cyclopentylene, cyclohexylene and cyclooctylene groups.

The bridged, cycloaliphatic group including $Z_6$ may have a substituent. Examples of the substituent include a halogen atom, an alkoxy group (containing preferably 1 to 4 carbon atoms), an alkoxycarbonyl group (containing preferably 1 to 5 carbon atoms), an acyl group (e.g., formyl or benzoyl group), an acyloxy group (e.g., propylcarbonyloxy or benzoyloxy), an alkyl group (containing preferably 1 to 4 carbon atoms), a carboxyl group, a hydroxyl group, and an alkylsulfonylsulfamoyl group (e.g., —CONHSO$_2$CH$_3$). The alkyl group as the substituent may further be substituted, for example, with a hydroxyl group, a halogen atom or an alkoxy group (containing preferably 1 to 4 carbon atoms).

In formula (VI), the oxygen atom of the ester group connected to $A_6$ may be connected to any carbon atom constituting the $Z_6$-containing, bridged, alicyclic ring structure.

Specific examples of the repeating unit represented by formula (VI) are illustrated below, however, the invention should not be construed as being limited thereto.

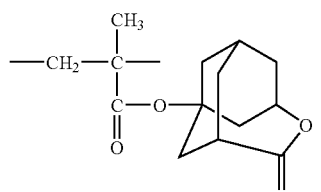

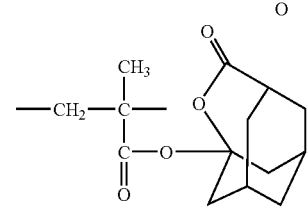

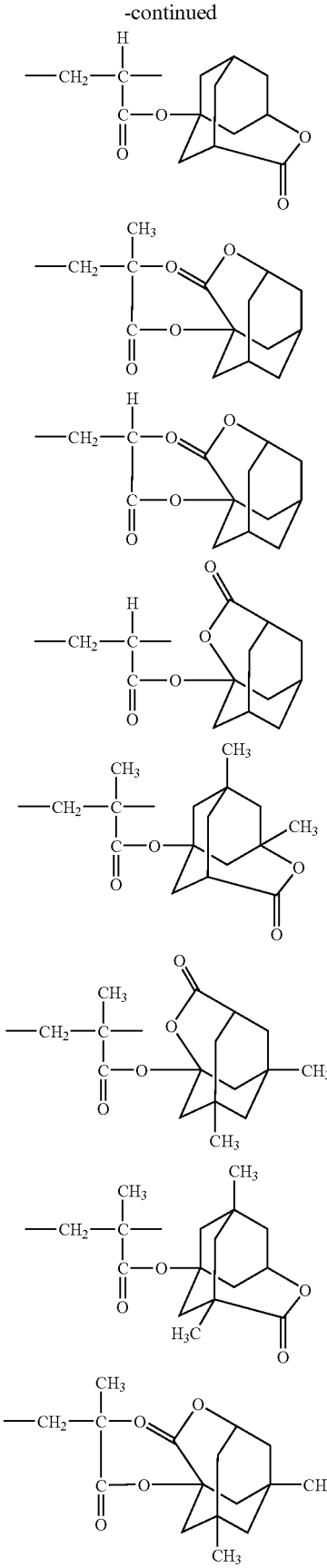

-continued

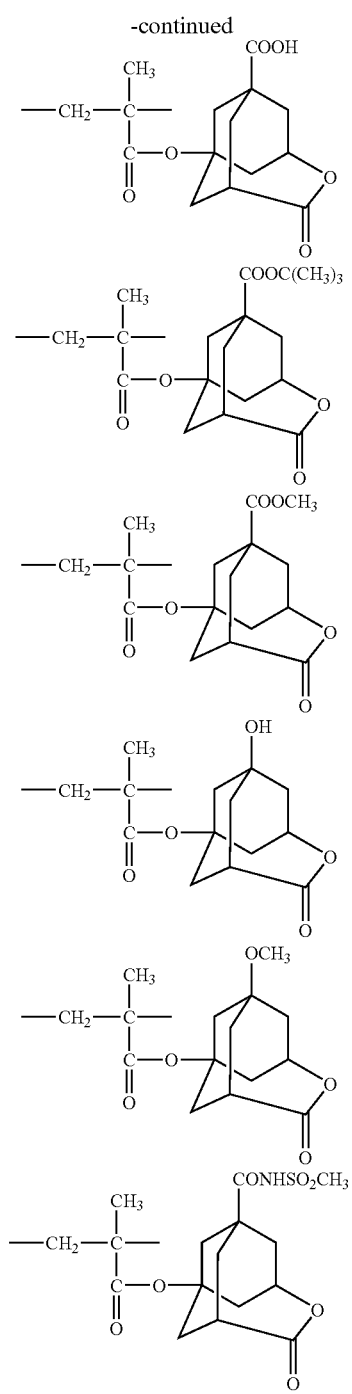

The acid-decomposable resin may further contain various repeating units in addition to the above repeating units for the purpose of adjusting dry etching resistance, standard developing solution aptitude, adhesion to a substrate, resist profile, and other characteristics ordinarily required for resist, for example, resolution, heat resistance and sensitivity.

Examples of such repeating units include repeating units corresponding to monomers described below, but the invention should not be construed as being limited thereto.

The introduction of additional repeating unit makes possible the minute control of characteristics required for the acid-decomposable resin, particularly (1) solubility in a coating solvent, (2) film forming property (glass transition temperature), (3) developing property with alkali, (4) reduction in a film thickness (hydrophobicity, selection of alkali-soluble group), (5) adhesion of the unexposed area to a substrate, and (6) dry etching resistance.

Examples of such monomers include compounds having one addition-polymerizable unsaturated bond, for example, acrylates, methacrylates, acrylamides, methacrylamides, allyl compounds, vinyl ethers and vinyl esters.

Specific examples of the monomer include the following:

acrylates (preferably an alkyl acrylate containing an alkyl group having 1 to 10 carbon atoms), e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate;

methacrylates (preferably an alkyl methacrylate containing an alkyl group having 1 to 10 carbon atoms), e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate;

acrylamides, for example, acrylamide, an N-alkylacrylamide (the alkyl group of which is an alkyl group having 1 to 10 carbon atoms, e.g., methyl, ethyl, propyl, butyl, tert-butyl, heptyl, octyl, cyclohexyl or hydroxyethyl group), an N,N-dialkylacrylamide (the alkyl group of which is an alkyl group having 1 to 10 carbon atoms, e.g., methyl, ethyl, butyl, isobutyl, ethylhexyl or cyclohexyl group), N-hydroxyethyl-N-methylacrylamide and N-2-acetamidoethyl-N-acetylacrylamide;

methacrylamides, for example, methacrylamide, an N-alkylmethacrylamide (the alkyl group of which is an alkyl group having 1 to 10 carbon atoms, e.g., methyl, ethyl, tert-butyl, ethylhexyl, hydroxyethyl or cyclohexyl group), an N,N-dialkylmethacrylamide (the alkyl group of which includes, e.g., ethyl, propyl and butyl groups) and N-hydroxyethyl-N-methylmethacrylamide; allyl compounds, for example, an allyl ester (e.g., allyl acetate, allyl caproate, ally caprate, allyl laurate, allyl palmitate, allyl stearate, allyl benzoate, allyl acetoacetate or ally lactate) and allyl oxyethanol;

vinyl ethers, for example, an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether or tetrahydrofurfuryl vinyl ether);

vinyl esters, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate or vinyl cyclohexylcarboxylate;

dialkyl itaconates, for example, dimethyl itaconate, diethyl itaconate or dibutyl itaconate;

monoalkyl or dialkyl fumarates, for example, dibutyl fumarate;

and others, for example, crotonic acid, itaconic acid, maleic anhydride, maleimide, acrylonitrile, methacrylonitrile or maleonitrile.

In addition, any addition-polymerizable unsaturated compounds copolymerizable with monomers corresponding to the repeating units described above may be employed.

A molar ratio of each repeating unit in the acid-decomposable resin can be appropriately determined taking the adjustment of many factors including dry etching resistance of resist, standard developing solution aptitude, adhesion to a substrate, resist profile, and other characteristics ordinarily required for resist, for example, resolution, heat resistance and sensitivity into consideration.

A content of the repeating unit having a partial structure containing an alicyclic hydrocarbon represented by any one of formulae (pI) to (pVI) is preferably from 30 to 70% by mole, more preferably from 35 to 65% by mole, and still more preferably from 40 to 60% by mole, based on the total repeating units in the acid-decomposable resin.

A content of the repeating unit corresponding to the additional copolymer component described above can be appropriately determined depending on the desired performance of resist. In general, the content is preferably 99% by mole or less, more preferably 90% by mole or less, and still more preferably 80% by mole or less, based on the mole number of the repeating unit having a partial structure containing an alicyclic hydrocarbon represented by any one of formulae (pI) to (pVI).

When the composition of the invention is used for ArF exposure, it is preferred that the acid-decomposable resin does not contain an aromatic group in order to ensure transparency of the ArF beam.

In the acid-decomposable resin, a content of the repeating unit having the acid-decomposable group is preferably from 15 to 50% by mole, more preferably from 20 to 40% by mole, based on the amount of the total repeating units.

The acid-decomposable resin (A) for use in the invention can be synthesized according to conventional methods, for example, radical polymerization. For instance, in an ordinary synthesis method, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent dissolving the composition of the invention, e.g., propylene glycol monomethyl ether acetate, if desired, to form a uniform solution, and under inert gas atmosphere, for example, nitrogen or argon, polymerization is initiated using a commercially available radical initiator (e.g., an azo initiator or a peroxide) while heating, if desired. The initiator is further added or separately added, if desired. After the completion of the reaction, the reaction mixture is poured into a solvent to collect the resulting powder or solid, thereby obtaining the desired polymer.

The concentration of reaction is ordinarily not less than 20% by weight, preferably not less than 30% by weight, and more preferably not less than 40% by weight. The reaction temperature is ordinarily from 10 to 150° C., preferably from 30 to 120° C., and more preferably from 50 to 100° C.

As to the repeating structural units shown by the foregoing specific examples, they may be used alone or as a mixture of a plurality of them.

Also, in the invention, resin (A) may be used alone or as a mixture of a plurality of them.

A weight average molecular weight of the resin (A) in accordance with the invention is usually from 1,000 to 200,000, preferably from 3,000 to 20,000 measured by a GPC method and calculated in terms of polystyrene.

The molecular weight distribution (Mw/Mn) is usually from 1 to 10, preferably from 1 to 5, still more preferably from 1 to 4. A resin having a smaller molecular weight distribution shows a better resolution, and provides a better resist form and a smoother side wall of a resulting resist pattern, thus being excellent in roughness.

A content of the total resins in accordance with the invention in the positive-working resist composition of the invention is preferably from 40 to 99.99% by weight, and more preferably from 50 to 99.97% by weight, based on the total solid content of the resist composition.

[2] (B) Compound Generating an Acid Upon Irradiation of Actinic Ray or Radiation The positive-working resist composition of the invention contains a compound that generates an acid upon irradiation of actinic ray or radiation (hereinafter also referred to as "acid generator").

The acid generator can be appropriately selected from photoinitiators for photo-cationic polymerization, photoinitiators for photo-radical polymerization, photo-achromatic agents for dyes, photo-discoloring agents, known compounds generating an acid upon irradiation of an actinic ray or radiation used for a microresist and mixtures thereof.

Examples of the acid generator include an onium salt, for example, a diazonium salt, an ammonium salt, a phosphonium salt, an iodonium salt, a sulfonium salt, a selenonium salt or an arsonium salt, an organic halogeno compound, an organo-metal/organic halide, a photo-acid generator having an o-nitrobenzyl type protective group, a compound generating a sulfonic acid upon photolysis, which is represented by iminosulfonate, and a disulfone compound.

Also, polymer compounds in which a group or compound generating an acid upon irradiation of an actinic ray or radiation is introduced into the main chain or side chain thereof, for example, compounds as described, for example, in U.S. Pat. No. 3,849,137, German Patent 3,914,407, JP-A-63-26653, JP-A-55-164824, JP-A-62-69263, JP-A-63-146038, JP-A-63-163462, JP-A-62-153853 and JP-A-63-146029 may be used.

Further, compounds described, for example, in U.S. Pat. No. 3,779,778 and European Patent 126,712 may be used.

Of the acid generators, those which can be particularly effectively used are described below.

(1) Compounds Represented by the Following Formula (PAGI) (Hereinafter Also Referred to as "Acid Generator (PAGI))

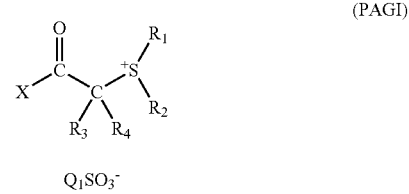

(PAGI)

In formula (PAGI), $R_1$ and $R_2$, which may be the same or different, each represents an alkyl group, an aryl group or a hetero ring structure. $R_1$ and $R_2$ may be connected to each other to form a ring. $R_3$ and $R_4$, which may be the same or different, each represents a hydrogen atom, an alkyl group or an aryl group. $R_3$ and $R_4$ may be connected to each other to form a ring. X represents an alkyl group, an aryl group, an alicyclic hydrocarbyl group, a group having a hetero ring structure or a combination thereof, provided that at least one of $R_1$ to $R_4$ and X represents an alkyl group having 7 or more carbon atoms or that at least one of $R_1$ to $R_4$ and X contains as a substituent an alkyl group having 7 or more carbon atoms. $Q_1$ represents a fluorine-substituted alkyl group, a fluorine-substituted aryl group or a fluorinated alkyl group-substituted aryl group.

The alkyl group represented by any one of $R_1$ to $R_4$ is preferably an alkyl group having 1 to 30 carbon atoms. Examples of the alkyl group represented by any one of $R_1$ to $R_4$ include a straight or branched alkyl group such as methyl, ethyl, propyl, n-butyl, sec-butyl, tert-butyl, pentyl, hexyl, heptyl, octyl, nonyl, decyl, undecyl, dodecyl, tridecyl and tetradecyl groups, and a cyclic alkyl group such as cyclopropyl, cyclopentyl, cyclohexyl, adamantly, norbornyl and bornyl groups.

The aryl group represented by any one of $R_1$ to $R_4$ and X is preferably an aryl group having 6 to 14 carbon atoms, and examples thereof include phenyl, tolyl and naphtyl groups.

A hetero ring structure in the group having a hetero ring structure represented by any one of $R_1$, $R_2$ and X is a ring structure containing a hetero atom such as an oxygen atom, a sulfur atom or a nitrogen atom within the ring. Examples thereof include furan, thiophene and a structure wherein a benzene ring is further condensed with furan or thiophene such as benzofuran or benzothiophene.

$R_1$ and $R_2$ may be connected to each other to form a ring. $R_3$ and $R_4$ may be connected to each other to form a ring.

In such case, examples of the group formed by $R_1$ and $R_2$, or $R_3$ and $R_4$, connected to each other include an alkylene group having 4 to 10 carbon atoms, preferably butylene, pentylene and hexylene groups, and particularly preferably butylene and pentylene groups.

Within the ring formed by $R_1$ and $R_2$, or $R_3$ and $R_4$, connected to each other may exist, for example, a carbonyl group, an oxygen atom or a sulfur atom.

The alkyl group represented by X is preferably an alkyl group having 1 to 30 carbon atoms, and examples thereof include a straight or branched alkyl group such as methyl, ethyl, propyl, n-butyl, sec-butyl, tert-butyl, pentyl, hexyl, heptyl, octyl, nonyl, decyl, undecyl, dodecyl, tridecyl and tetradecyl groups.

The alicyclic hydrocarbyl group represented by X is preferably an alicyclic hydrocarbyl group having 3 to 30 carbon atoms, and examples thereof include an adamantly group, a noradamantyl group, a decalain residue, a tricyclodecanyl group, tetracyclododecanyl group, a norbornyl group, a cedrol group, a cyclopropyl group, a cyclopentyl group, a cyclohexyl group, a cycloheptyl group, a cyclooctyl group, a cyclodecanyl group and a cyclododecanyl group.

Examples of the combination of an alkyl group, an aryl group, an alicyclic hydrocarbon group and a group having a hetero ring structure represented by X, include: an alkyl group substituted with at least one of an aryl group, an alicyclic hydrocarbon group and a group having a hetero ring structure; an aryl group substituted with at least one of an alkyl group, an alicyclic hydrocarbon group and a group having a hetero ring structure; an alicyclic hydrocarbon group substituted with at least one of an alkyl group, an aryl group and a group having a hetero ring structure; and a group having a hetero ring structure substituted with at least one of an alkyl group, an aryl group and an alicyclic hydrocarbon group.

Each of the alkyl group, aryl group, alicyclic hydrocarbon group, group having a hetero ring structure, and ring formed by $R_1$ and $R_2$, or $R_3$ and $R_4$, connected to each other may be substituted, for example, with a nitro group, a halogen atom, a carboxyl group, a hydroxyl group, an amino group, a cyano group or an alkoxy group (containing preferably 1 to 12 carbon atoms). Further, the aryl group, alicyclic hydrocarbon group, group having a hetero ring structure, and ring formed by $R_1$ and $R_2$, or $R_3$ and $R_4$, connected to each other may be substituted with an alkyl group (containing preferably 1 to 30 carbon atoms). The alkyl group, alicyclic hydrocarbon group, group having a hetero ring structure, and ring formed by $R_1$ and $R_2$, or $R_3$ and $R_4$, connected to each other may be substituted by an aryl group.

Examples of the alkyl moiety in the fluorine-substituted alkyl group for $Q_1$ include an alkyl group having preferably 1 to 30 carbon atoms, for example, methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicodecyl, cyclopropyl, cyclopentyl, cyclohexyl, adamantly, norbornyl and bornyl groups.

Examples of the aryl moiety in the fluorine-substituted aryl group for $Q_1$ include an aryl group having preferably 6 to 14 carbon atoms, for example, phenyl, tolyl and naphthyl groups.

Examples of the fluorinated alkyl moiety in the fluorinated alkyl group-substituted alkyl group for $Q_1$ include a fluoroalkyl group having preferably 1 to 5 carbon atoms, for example, trifluoromethyl, difluoromethyl, monofluoromethyl and pentafluoroethyl groups.

The alkyl and aryl groups in $Q_1$ may further have a substituent. Examples of such substituent include a halogen atom (excluding fluorine atom), an alkyl group, an alkoxy group and an alkylthio group.

In the acid generator (PAGI), at least one of $R_1$ to $R_4$ and X is an alkyl group having 7 or more carbon atoms, or at least one of $R_1$ to $R_4$ and X has an alkyl group having 7 or more carbon atoms as a substituent.

The alkyl group in the substituent includes an alkyl group in an alkoxy group.

The acid generator (PAGI) is preferably a compound of formula (PAGI) wherein at least one of $R_3$ and $R_4$ is an alkyl group having 7 or more carbon atoms, or a compound of formula (PAGI) wherein at least one of $R_3$, $R_4$ and X has an alkyl group having 7 or more carbon atoms as a substituent and X has a benzene ring.

The acid generator (PAGI) is preferably a compound of formula (PAGI) wherein at least one of $R_1$ and $R_2$ is an alkyl group having 7 or more carbon atoms, or a compound of formula (PAGI) wherein at least one of $R_1$ and $R_2$ has an alkyl group having 7 or more carbon atoms as a substituent and X does not include a benzene ring.

The acid generator (PAGI) is preferably a compound of formula (PAGI) wherein at least one of $R_1$ and $R_2$ is an alkyl group having 7 or more carbon atoms, or a compound of formula (PAGI) wherein at least one of $R_1$ and $R_2$ has an alkyl group having 7 or more carbon atoms as a substituent and X has a benzene ring, with the benzene ring having a substituent and/or a condensed ring group.

Examples of the condensed ring group which the benzene ring may have include 1 to 5 benzene rings and cyclohexane rings formed on the benzene ring.

Specific examples of the acid generator (PAGI) are illustrated below, but the invention should not be construed as being limited thereto.
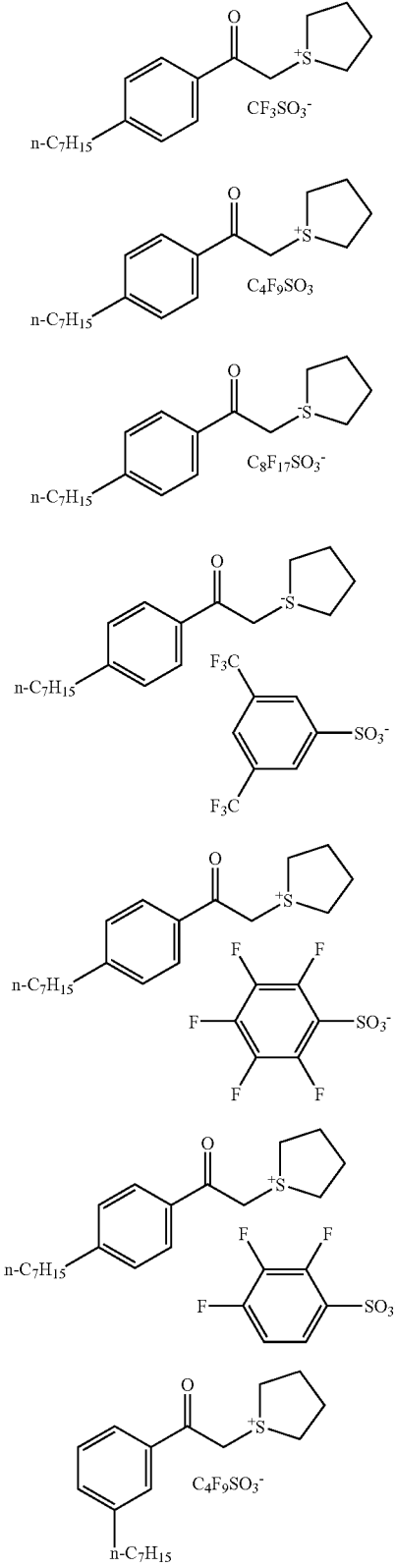
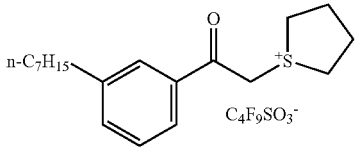
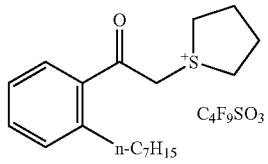
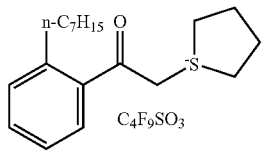
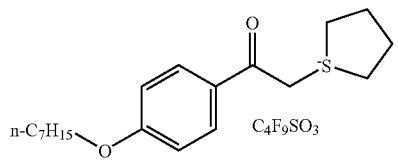
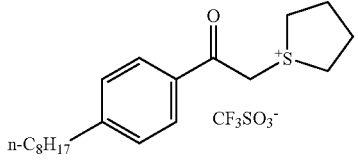
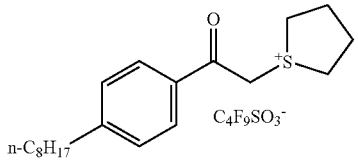
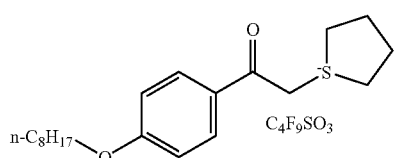
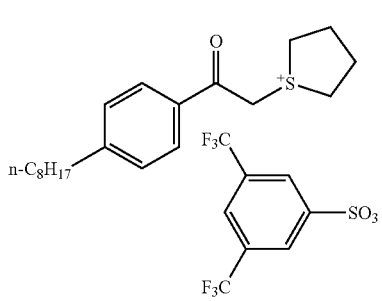

-continued
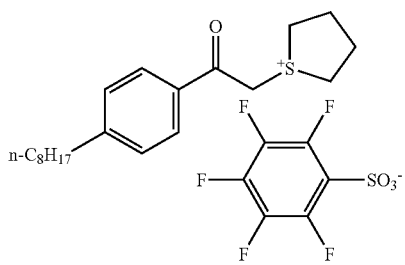
PAGI-16
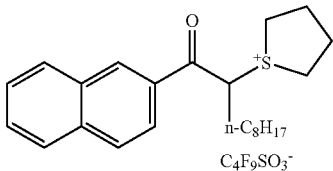
PAGI-22
PAGI-17
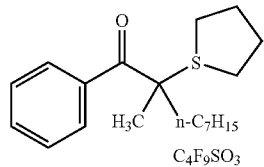
PAGI-23
PAGI-18
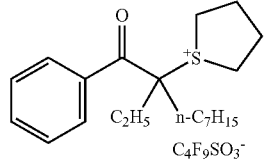
PAGI-24
PAGI-19
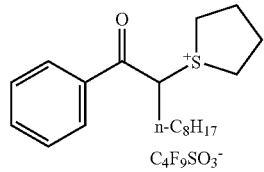
PAGI-25
PAGI-20
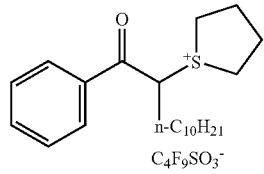
PAGI-26
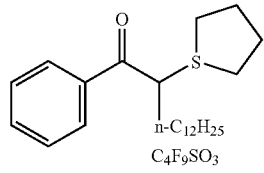
PAGI-27
PAGI-21
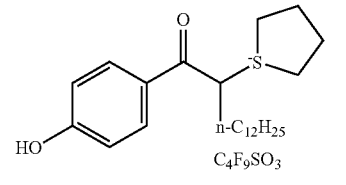
PAGI-28
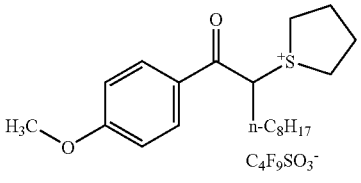
PAGI-29

-continued

PAGI-30, PAGI-31, PAGI-32, PAGI-33, PAGI-34, PAGI-35, PAGI-36, PAGI-37, PAGI-38, PAGI-39

PAGI-40, PAGI-41, PAGI-42, PAGI-43, PAGI-44, PAGI-45, PAGI-46, PAGI-47, PAGI-48, PAGI-49

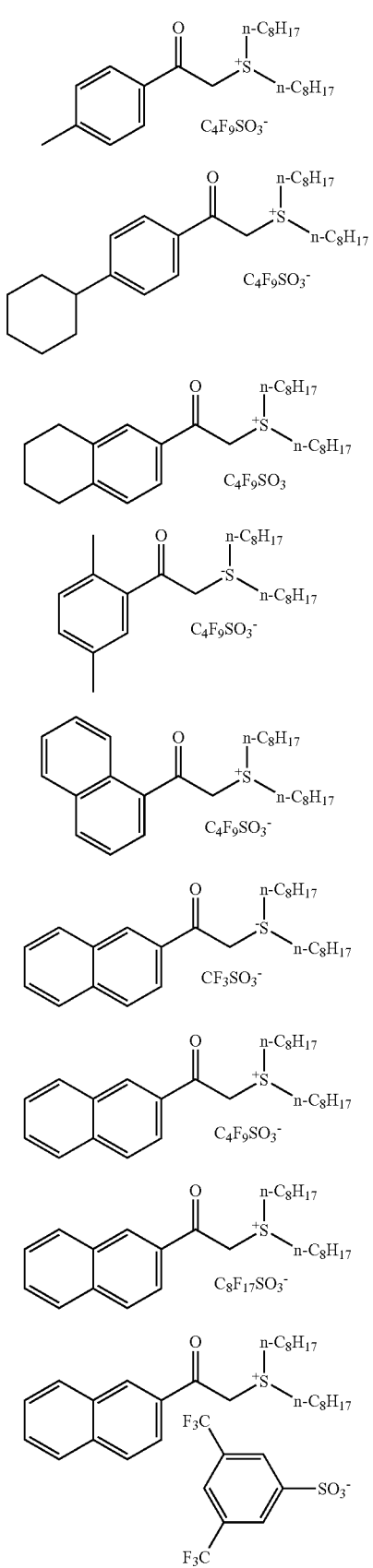
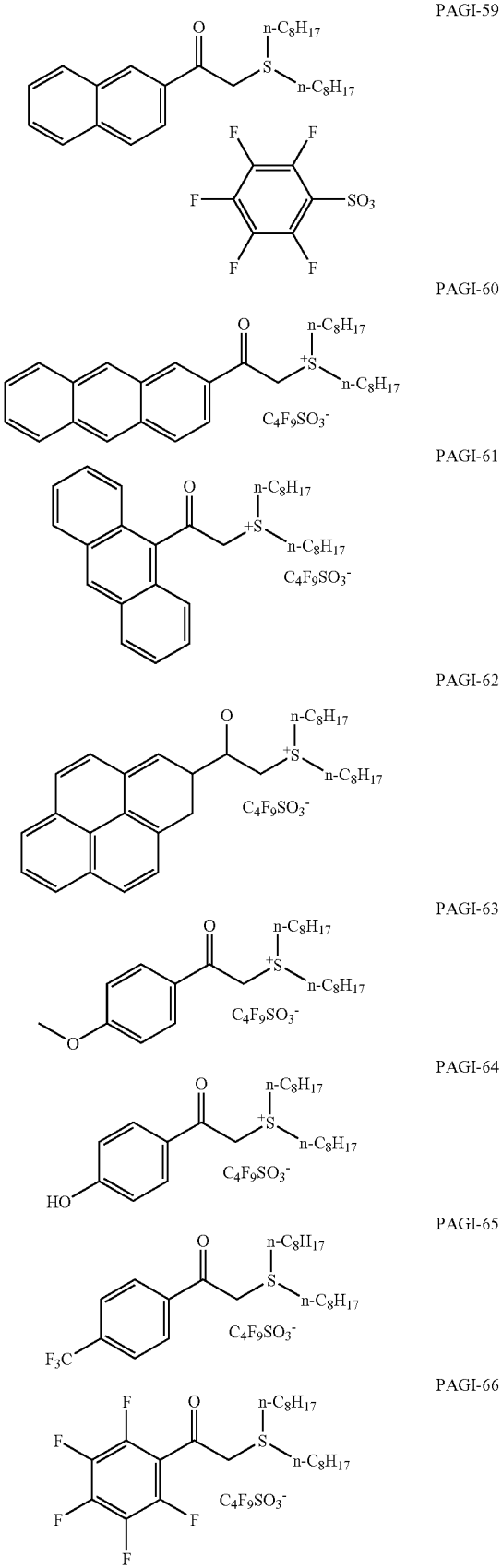

-continued

PAGI-67
PAGI-68
PAGI-69
PAGI-70
PAGI-71
PAGI-72
PAGI-73

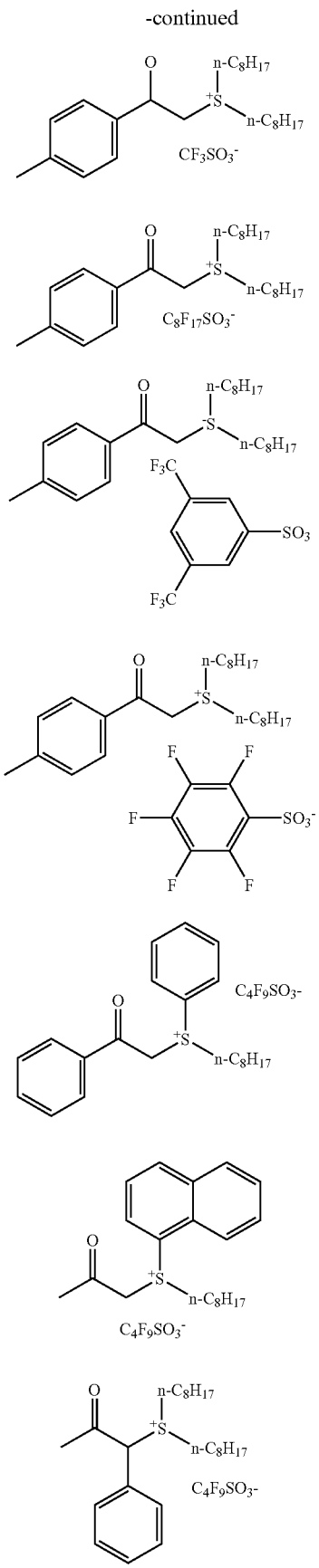

-continued

PAGI-74
PAGI-75

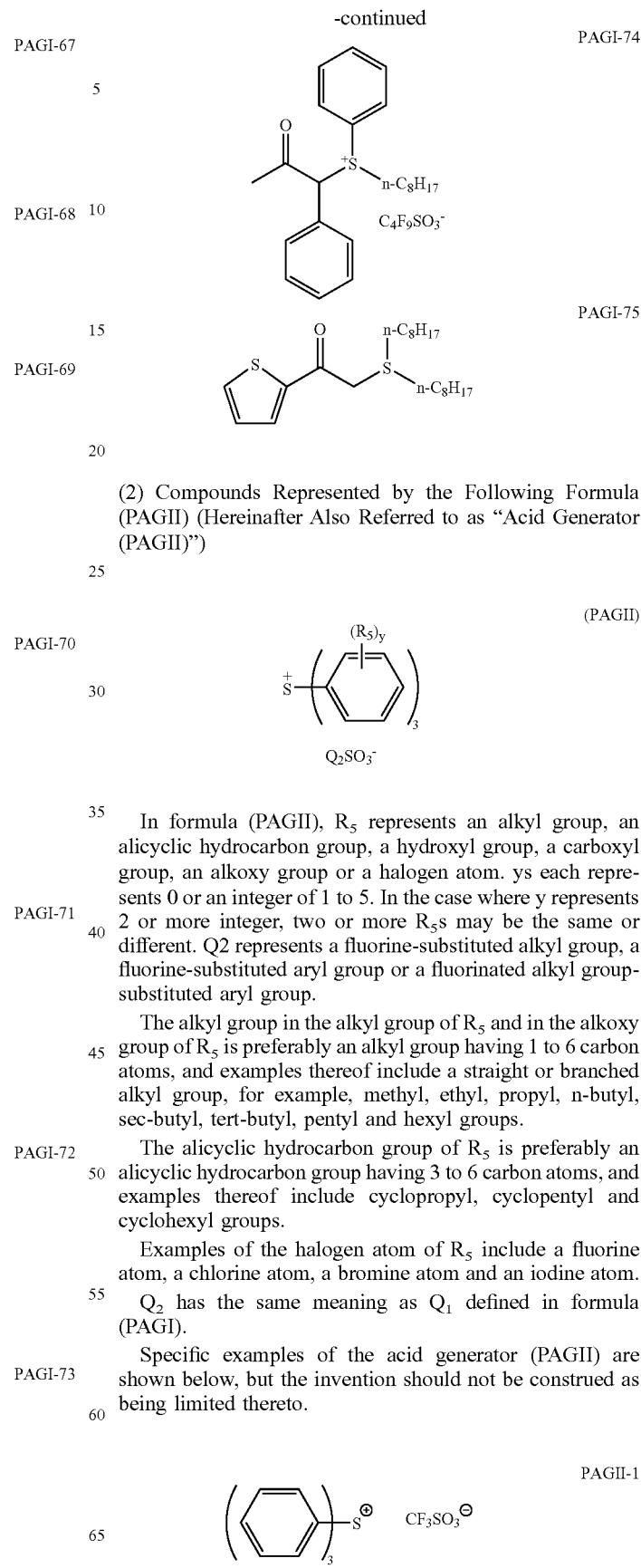

(2) Compounds Represented by the Following Formula (PAGII) (Hereinafter Also Referred to as "Acid Generator (PAGII)")

(PAGII)

In formula (PAGII), $R_5$ represents an alkyl group, an alicyclic hydrocarbon group, a hydroxyl group, a carboxyl group, an alkoxy group or a halogen atom. ys each represents 0 or an integer of 1 to 5. In the case where y represents 2 or more integer, two or more $R_5$s may be the same or different. Q2 represents a fluorine-substituted alkyl group, a fluorine-substituted aryl group or a fluorinated alkyl group-substituted aryl group.

The alkyl group in the alkyl group of $R_5$ and in the alkoxy group of $R_5$ is preferably an alkyl group having 1 to 6 carbon atoms, and examples thereof include a straight or branched alkyl group, for example, methyl, ethyl, propyl, n-butyl, sec-butyl, tert-butyl, pentyl and hexyl groups.

The alicyclic hydrocarbon group of $R_5$ is preferably an alicyclic hydrocarbon group having 3 to 6 carbon atoms, and examples thereof include cyclopropyl, cyclopentyl and cyclohexyl groups.

Examples of the halogen atom of $R_5$ include a fluorine atom, a chlorine atom, a bromine atom and an iodine atom.

$Q_2$ has the same meaning as $Q_1$ defined in formula (PAGI).

Specific examples of the acid generator (PAGII) are shown below, but the invention should not be construed as being limited thereto.

PAGII-1

-continued

PAGII-2
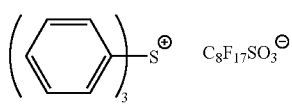

PAGII-3
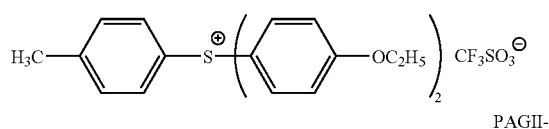

PAGII-4
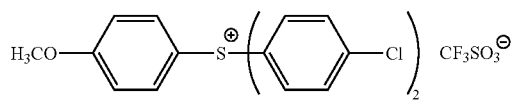

PAGII-5
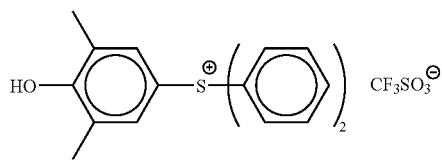

PAGII-6
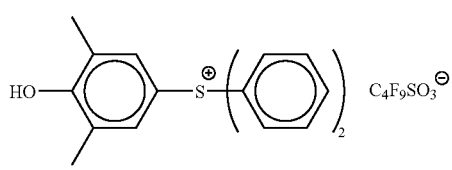

PAGII-7
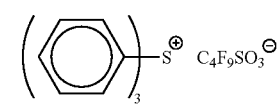

PAGII-8
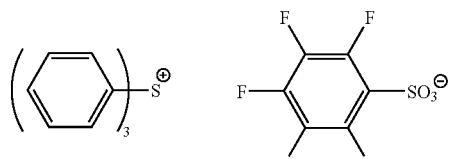

PAGII-9
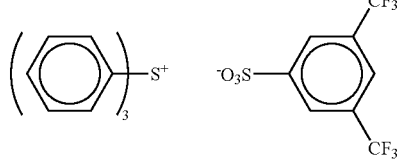

(3) Iodonium Salts Represented by Formula (PAG1) Shown Below or Sulfonium Salts Represented by Formula (PAG2) Shown Below:

(PAG1)
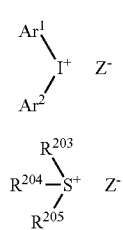

(PAG2)

In formulae (PAG1) and (PAG2), $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxyl group, a mercapto group and a halogen atom.

$R^{203}$, $R^{204}$ and $R^{205}$ each independently represents a substituted or unsubstituted alkyl group or a substituted or unsubstituted aryl group, preferably an aryl group having 6 to 14 carbon atoms, an alkyl group having 1 to 8 carbon atoms or a substituted derivative thereof.

Preferred examples of the substituent include, for the aryl group, an alkoxy group having 1 to 8 carbon atoms, an alkyl group having 1 to 8 carbon atoms, a nitro group, a carboxyl group, a hydroxyl group and a halogen atom and, for the alkyl group, an alkoxy group having 1 to 8 carbon atoms, a carboxyl group and an alkoxycarbonyl group.

$Z^-$ represents a counter anion. Examples of the counter anion include $BF_4^-$, $AsF_6^-$, $PF_6^-$, $SbF_6^-$, $SiF_6^-$, $ClO_4^-$, an alkanesulfonic acid anion, a benzenesulfonic acid anion, a condensed polynucleic aromatic sulfonic acid anion, e.g., a naphthalenesulfonic acid anion and an anthraquinonesulfonic acid anion, and a dye containing a sulfonic acid group. However, the invention should not be construed as being limited thereto.

Two of $R^{203}$, $R^{204}$ and $R^{205}$ or $Ar^1$ and $Ar^2$ may be connected to each other through a single bond or a substituent.

Specific examples of the compound are set forth below, but the invention should not be construed as being limited thereto.

(PAG1-1)
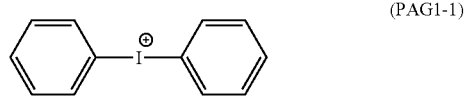

(PAG1-2)
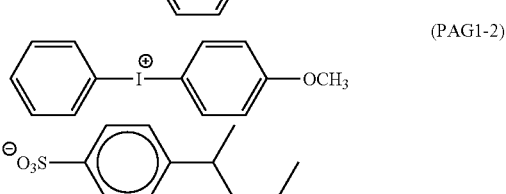

(PAG1-3)
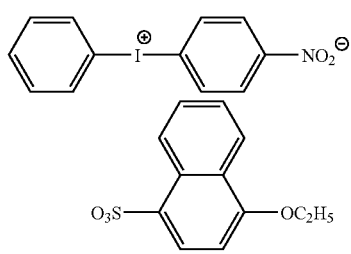

-continued
(PAG1-4)
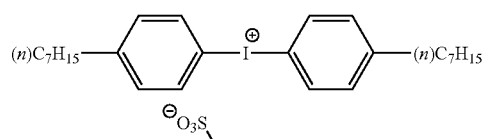
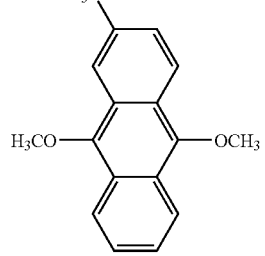
(PAG1-5)
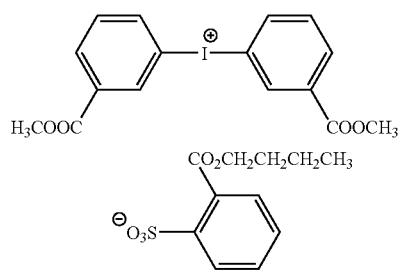
(PAG1-6)
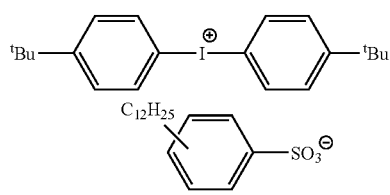
(PAG1-7)
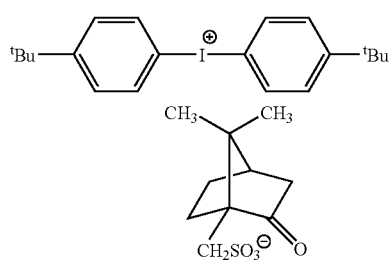
(PAG1-8)
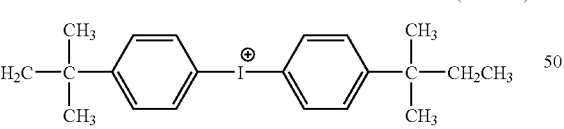
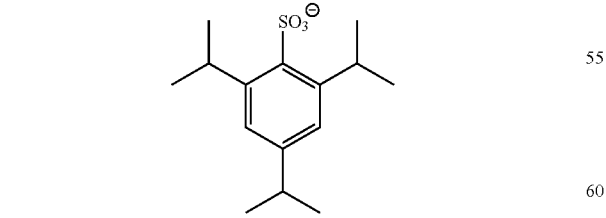
(PAG2-1)
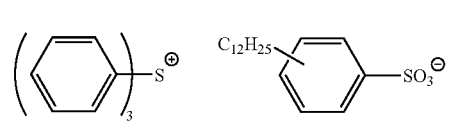
-continued
(PAG2-2)
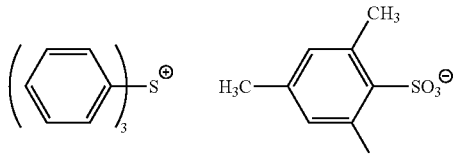
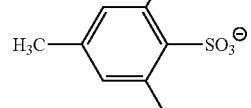
(PAG2-3)
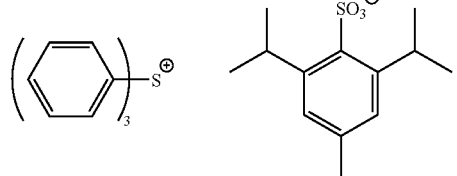
(PAG2-4)
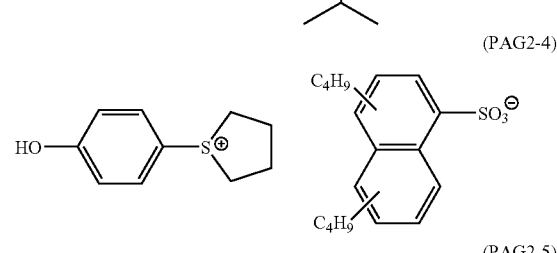
(PAG2-5)
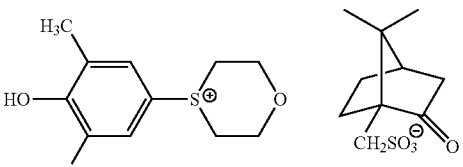
(PAG2-6)
(PAG2-7)
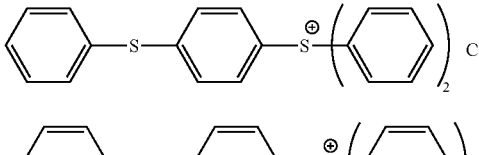
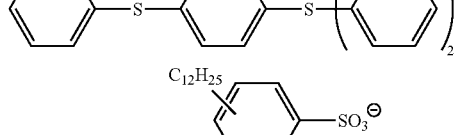
(PAG2-8)
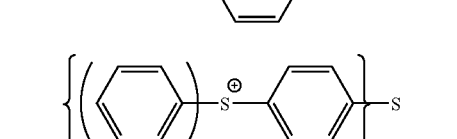
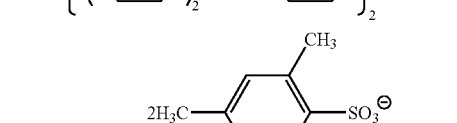
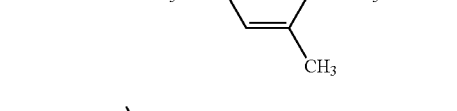
(PAG2-9)
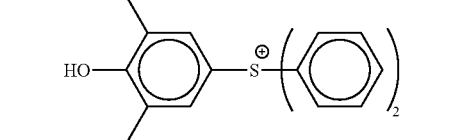

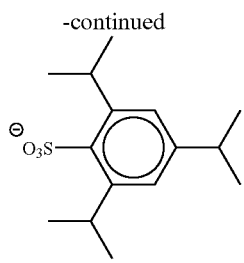

The onium salts represented by formulae (PAG1) and (PAG2) are known and can be synthesized by methods as described, for example, in U.S. Pat. Nos. 2,807,648 and 4,247,473 and JP-A-53-101331.

(4) Disulfone Derivatives Represented by Formula (PAG3) Shown Below or Iminosulfonate Derivatives Represented by Formula (PAG4) Shown Below:

(PAG3)

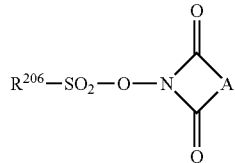
(PAG4)

In formulae (PAG3) and (PAG4), $Ar^3$ and $Ar^4$ each independently represents a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Specific examples of the compound are set forth below, but the invention should not be construed as being limited thereto.

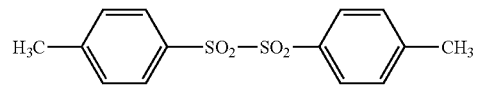
(PAG3-1)

(PAG3-2)

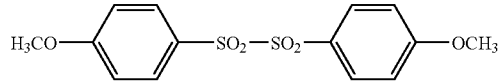
(PAG3-3)

(PAG3-4)

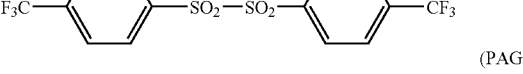

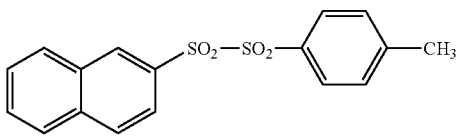
(PAG3-5)

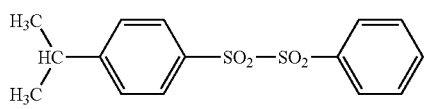
(PAG3-6)

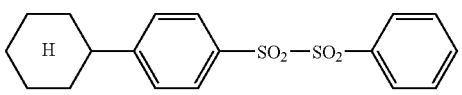
(PAG3-7)

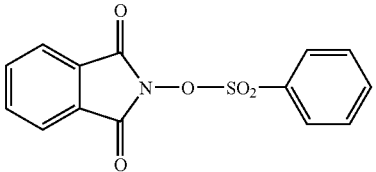
(PAG4-1)

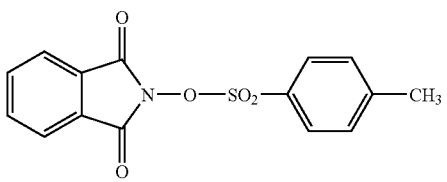
(PAG4-2)

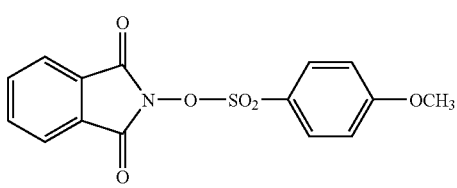
(PAG4-3)

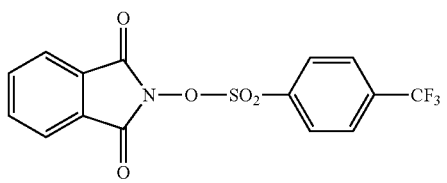
(PAG4-4)

(PAG4-5)

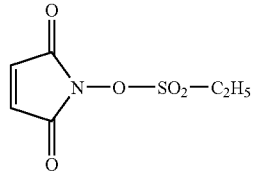
(PAG4-6)

-continued

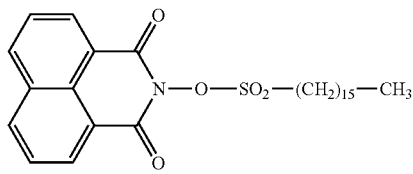
(PAG4-7)

(5) Diazodisulfone Derivatives Represented by Formula (PAG5) Shown Below:

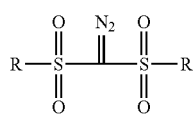
(PAG5)

In formula (PAG5), R represents a straight chain, branched or cyclic alkyl group or a substituted or unsubstituted aryl group.

Specific examples of the compound are set forth below, but the invention should not be construed as being limited thereto.

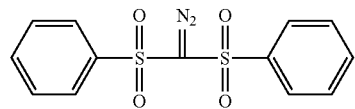
(PAG5-1)

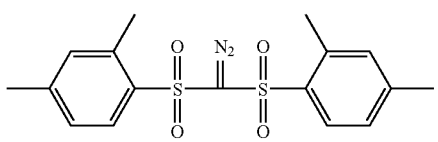
(PAG5-2)

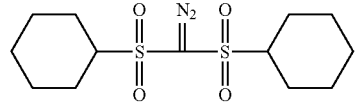
(PAG5-3)

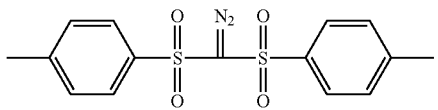
(PAG5-4)

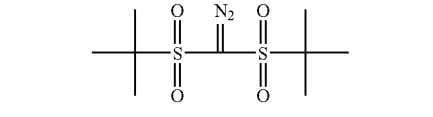
(PAG5-5)

The acid generators may be used alone or in combination of two or more thereof. As the acid generator, the acid generator (PAGII) is preferred.

A content of the acid generator in the positive-working resist composition is preferably from 0.1 to 20% by weight, more preferably from 0.5 to 20% by weight, still more preferably from 1 to 15% by weight, based on the solid component of the composition.

[3] Nonionic Compound Having at Least One Partial Structure Represented by Formula (I) or (II) Shown Below and Having at Least Either a Melting Point of 35° C. or More or a Boiling Point of 100° C./10 mmHg or More The positive-working resist composition of the invention contains a nonionic compound having at least one partial structure represented by formula (I) or (II) shown below and having at least either a melting point of 35° C. or more or a boiling point of 100° C./10 mmHg or more (hereinafter also referred to as "compound of Component (C)").

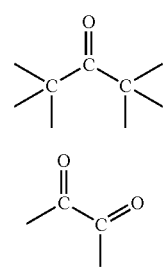

(I)

(II)

The compound of component (C) is preferably a compound which has an alicyclic structure or a bridged alicyclic structure and wherein at least one ring constituting the alicyclic structure or bridged alicyclic structure has at least one partial structure represented by formula (I) or (II) shown above.

The compound of component (C) is preferably a compound having an alicyclic structure or bridged alicyclic structure having at least one ring or a combination of two or more rings selected from 4-membered to 15-membered rings, more preferably a compound having an alicyclic structure or bridged alicyclic structure having a combination of 2 to 10 rings, and particularly preferably a compound having an alicyclic structure or bridged alicyclic structure having a combination of 2 to 8 rings.

The compound of component (C) preferably has a bridged alicyclic structure and does not have a benzene ring.

The compound of component (C) preferably has two or more, preferably 2 to 10, particularly preferably 2 to 8, of the partial structure represented by formula (I) shown above, or preferably has at least one partial structure represented by formula (II) shown above and does not have a benzene ring.

Atoms constituting the compound of component (C) preferably comprise carbon atoms and hydrogen atoms alone except for the partial structure represented by formula (I) or (II) shown above.

The compound of component (C) preferably has a melting point of 35° C. to 300° C., more preferably 35° C. to 270° C.

The compound of component (C) preferably has a boiling point of 100° C./10 mmHg to 100° C./1 mmHg, more preferably 100° C./10 mmHg to 100° C./2 mmHg.

The compound (C) has a molecular weight of preferably 95 to 1,500, more preferably 110 to 1,000.

Specific examples of the compound of Component (C) are set forth below, but the invention should not be construed as being limited thereto.

[chem. 54]
(C-1) 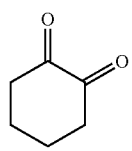
(C-2) 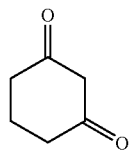
(C-3) 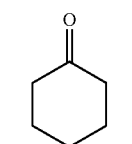
(C-4) 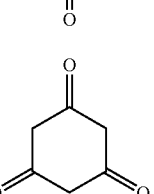
(C-5) 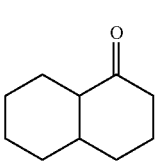
(C-6) 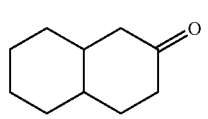
(C-7) 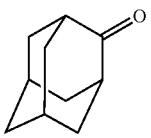
(C-8) 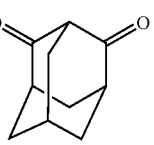
(C-9) 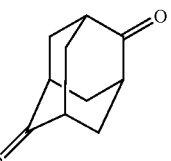
(C-10) 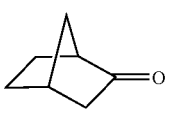
-continued
(C-11) 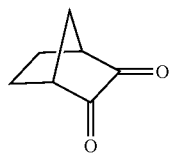
(C-12) 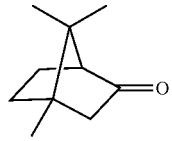
(C-13) 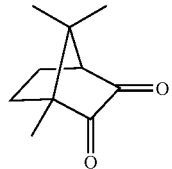
(C-14) 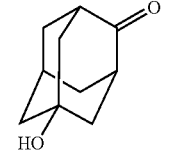
(C-15) 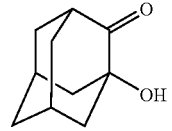
(C-16) 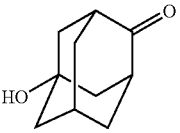
(C-17) 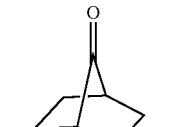
(C-18) 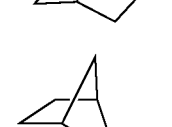
(C-19) 
(C-20) 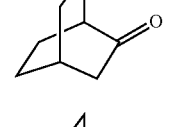

-continued
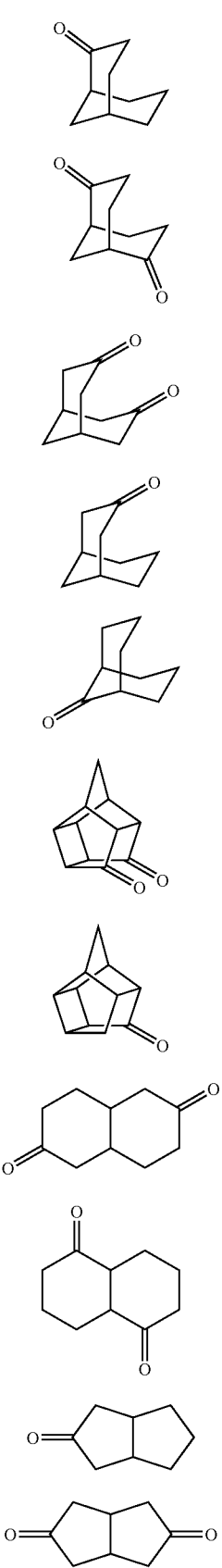
(C-21)
(C-22)
(C-23)
(C-24)
(C-25)
(C-26)
(C-27)
(C-28)
(C-29)
(C-30)
(C-31)
-continued
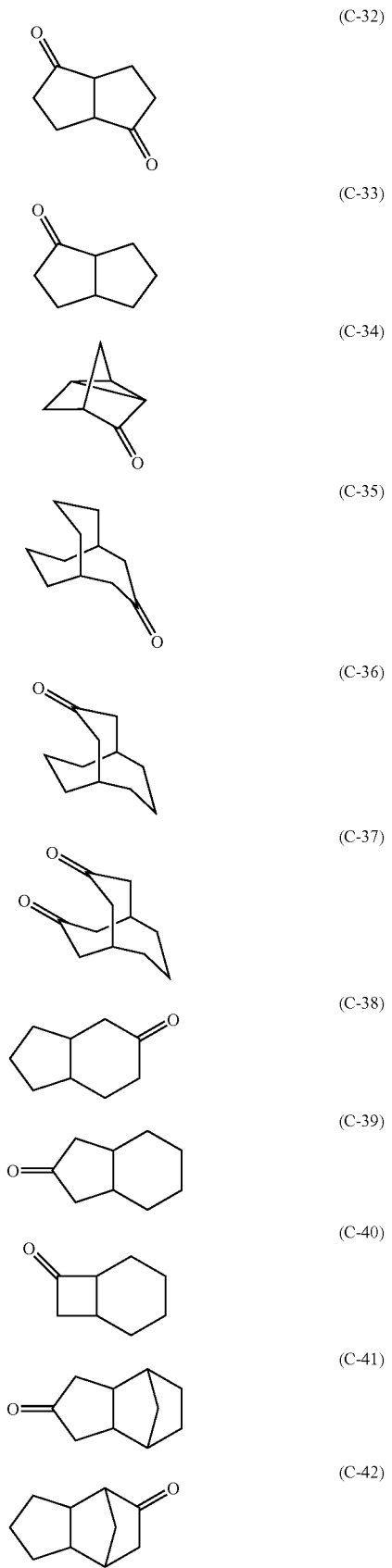
(C-32)
(C-33)
(C-34)
(C-35)
(C-36)
(C-37)
(C-38)
(C-39)
(C-40)
(C-41)
(C-42)

(C-43) 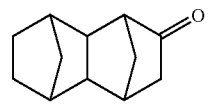
(C-44) 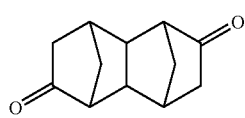
(C-45) 
(C-46) 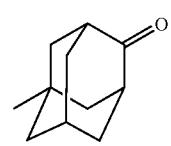
(C-47) 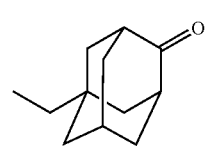
(C-48) 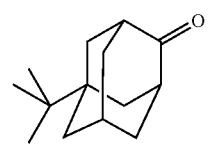
(C-49) 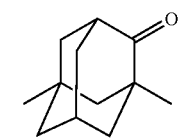
(C-50) 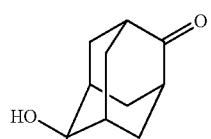
(C-51) 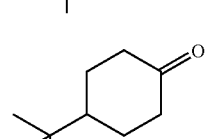
(C-52) 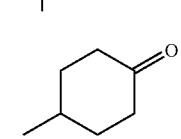
(C-53) 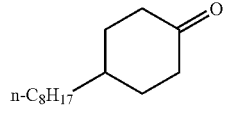
(C-54) 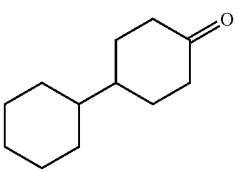
(C-55) 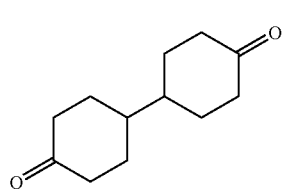
(C-56) 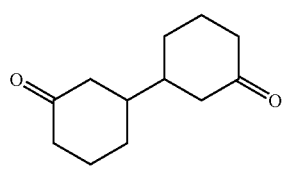
(C-57) 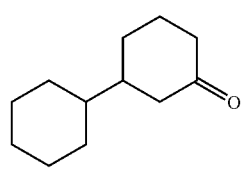
(C-58) 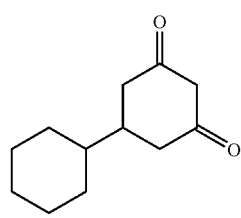
(C-59) 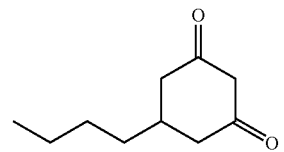
(C-60) 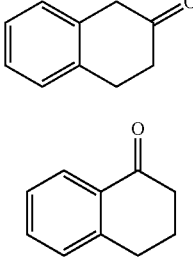
(C-61) 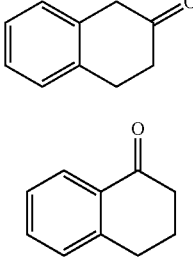
(C-62) 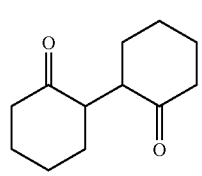

-continued
(C-63) 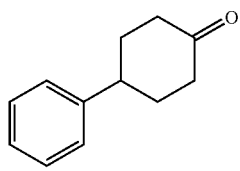
(C-64) 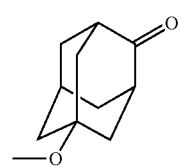
(C-65) 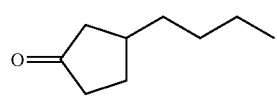
(C-66) 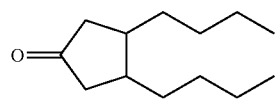
(C-67) 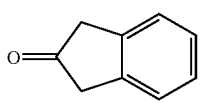
(C-68) 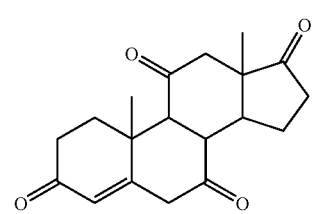
(C-69) 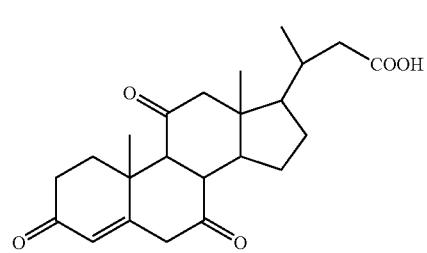
(C-70) 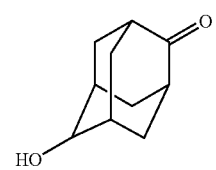
(C-71) 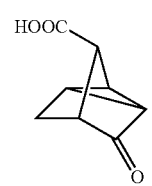
-continued
(C-72) 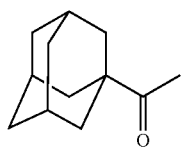
(C-73) 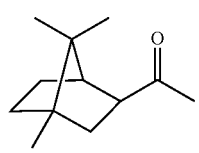
(C-74) 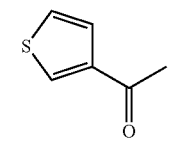
(C-75) 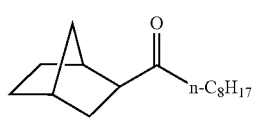
(C-76) 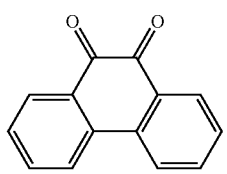
(C-77) 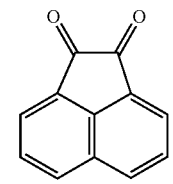
(C-78) 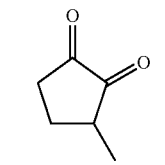
(C-79) 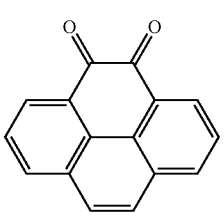
(C-80) 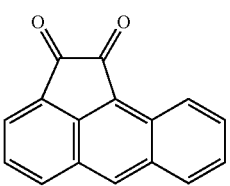

-continued
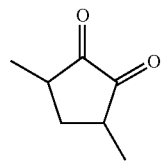 (C-81)
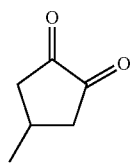 (C-82)
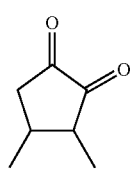 (C-83)
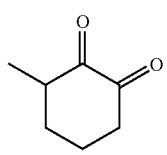 (C-84)
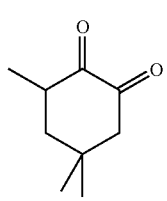 (C-85)
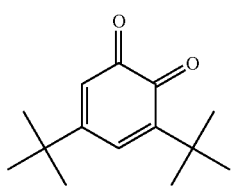 (C-86)
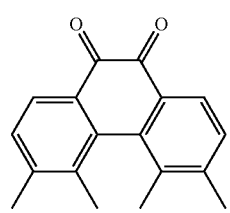 (C-87)
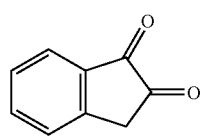 (C-88)
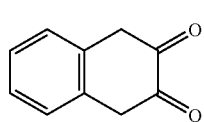 (C-89)
-continued
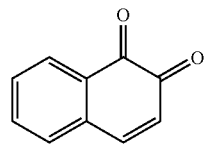 (C-90)
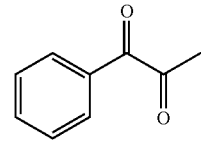 (C-91)
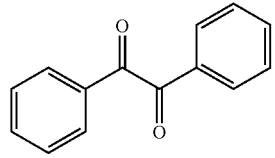 (C-92)
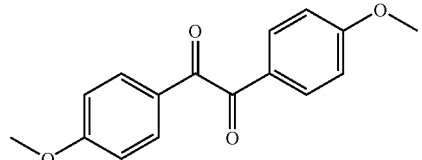 (C-93)
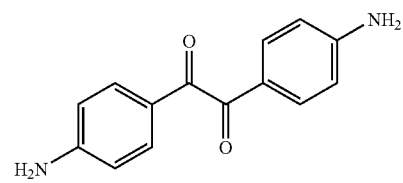 (C-94)
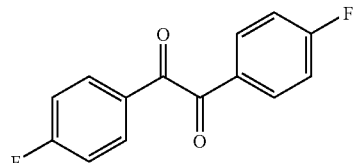 (C-95)
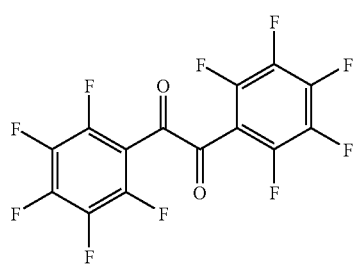 (C-96)
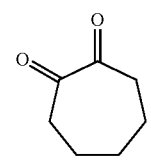 (C-97)
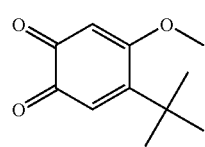 (C-98)

-continued
(C-99) 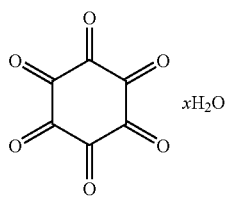
(C-100) 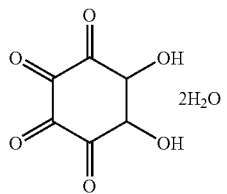
(C-101) 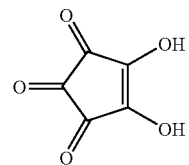
(C-102) 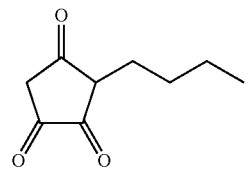
(C-103) 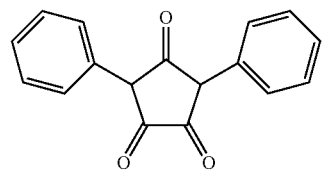
(C-104) 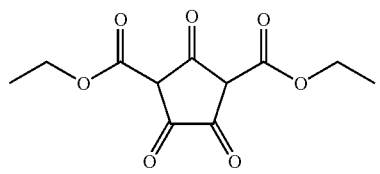
(C-105) 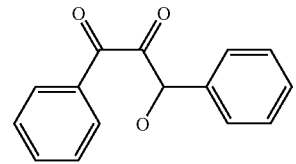
(C-106) 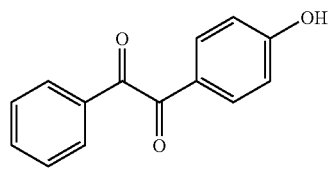
-continued
(C-107) 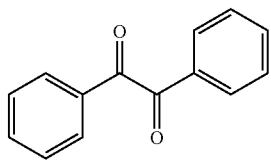
(C-108) 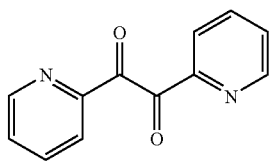
(C-109) 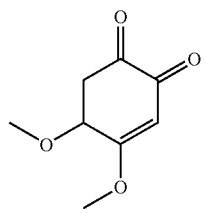
(C-110) 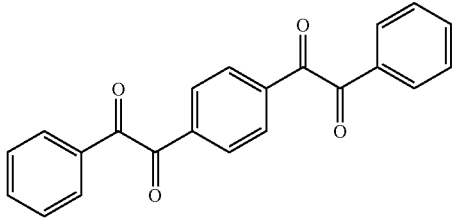
(C-111) 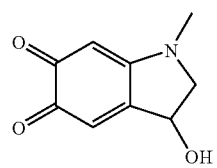
(C-112) 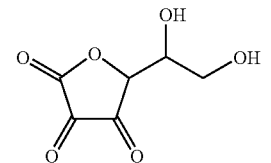
(C-113) 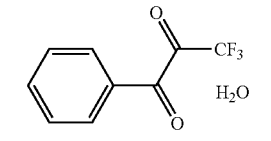
(C-114) 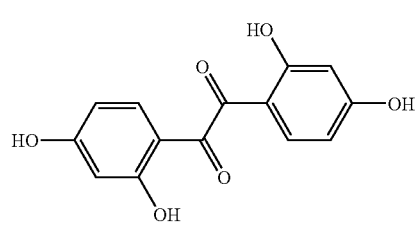

-continued (C-115) 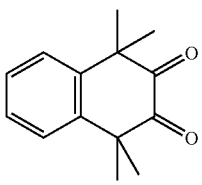

(C-116)

(C-117)

(C-118)

(C-119)

(C-120)

(C-121) 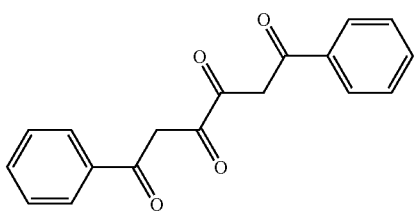

-continued (C-122) 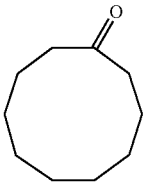

The compounds of component (C) may be used alone or in combination of two or more thereof. A content of the compound of component (C) in the positive-working resist composition is preferably from 0.05 to 10.0% by weight, still more preferably from 0.07 to 8.0% by weight, and still more preferably from 0.10 to 7.0% by weight, based on the solid component of the composition.

[4] (E) Nitrogen-Containing Basic Compound

It is preferred that the positive-working resist composition of the invention contains (E) a nitrogen-containing basic compound. As the nitrogen-containing basic compound (E), there may be used, for example, an organic amine, a basic ammonium salt and a basic sulfonium salt that do not deteriorate sublimation property and resist performance.

Of the nitrogen-containing basic compounds, organic amines are preferred in the point of providing excellent image characteristics.

For example, there may be used basic compounds described in JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-7-508840 (the term "JP-T" as used herein means a published Japanese Translation of a PCT patent application), U.S. Pat. Nos. 5,525,453, 5,629,134 and 5,667,938.

Preferred examples of the nitrogen-containing basic compound include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, hydroxypyridines, pyridines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine and tributylamine.

Of these, organic amines such as 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, hydroxypyridines, pyridines, 4,4'-diaminodiphenyl ether, triethylamine and tributylamine are preferred.

A content of the nitrogen-containing basic compound (E) is ordinarily from 0.001 to 10 parts by weight, preferably from 0.001 to 5 parts by weight, and still more preferably from 0.001 to 0.5 part by weight per 100 parts by weight of the solid content of the positive-working resist composition.

[5] (F) Fluorine-Base and/or Silicon-Base Surface Active Agent

It is preferred that the positive-working resist composition of the invention further contains (F) one or more of fluorine-base and/or silicon-base surface active agents (a fluorine atom-containing surface active agent, a silicon atom-containing surface active agent and a surface active agent containing both a fluorine atom and a silicon atom).

By the addition of the surface active agent (F), the positive-working resist composition of the invention can provide, at high sensitivity and good resolution, resist patterns having good adhesion and less defect in development, when an exposure light source of 250 nm or less, especially 220 nm or less is used.

Examples of the surface active agent (F) include those as described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576, 143, 5,294,511 and 5,824,451. Commercially available surface active agents described below may also be used as they are.

Examples of the commercially available surface active agent used include fluorine-base or silicon-base surface active agents, e.g., Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as a silicon-base surface active agent.

As the surface active agent, there may be used surfactants using a polymer having a fluoroaliphatic group derived from a fluoroaliphatic compound produced by a teromerization process (also called a teromer process) or an oliogomerization process (also called an oligmer process). The fluoroaliphatic compound can be synthesized according to the process described in JP-A-2002-90991 in addition to the known ones shown above.

As the polymer having a fluoroaliphatic group, copolymers between a monomer having a fluoroaliphatic group and (poly(oxyalkylene)) acrylate and/or (poly(oxyalkylene)) methacrylate are preferred. The comonomers may be distributed at random or may be block-copolymerized. Examples of the poly(oxyalkylene) group include a poly(oxyethylene) group, a poly(oxypropylene) group and a poly(oxybutylene) group. Also, the poly(oxyalkylene) group may be a unit having alkylene moieties different in chain length within the same chain, for example, poly(oxyethylene/oxypropylene/oxyethylene block linkage) or poly(oxyethylene/oxypropylene block linkage). Further, in addition to the copolymer between the monomer having a fluoroaliphatic group and (poly(oxyalkylene)) acrylate (or methacrylate), a copolymer of three or more comonomers obtained, for example, by copolymerizing two or more fluoroaliphatic group-having monomers different in the fluoroaliphatic group and two or more (poly(oxyalkylene)) acrylates (or methacrylates) may be used as well.

Examples of the commercially available surface active agent include Megafac F178, F-470, F-473, F-475, F-476 and F-472 (manufactured by Dainippon Ink and Chemicals, Inc.). Further, there may be illustrated a copolymer between an acrylate (or methacrylate) having a $C_6F_{13}$ group and (poly(oxyalkylene)) acrylate (or methacrylate), a copolymer between an acrylate (or methacrylate) having a $C_6F_{13}$ group, (poly(oxyethylene)) acrylate (or methacrylate) and (poly(oxypropylene)) acrylate (or methacrylate), a copolymer between an acrylate (or methacrylate) having a $C_8F_{17}$ group and (poly(oxyalkylene)) acrylate (or methacrylate), and a copolymer between an acrylate (or methacrylate) having a $C_8F_{17}$ group, (poly(oxyethylene)) acrylate (or methacrylate) and (poly(oxypropylene)) acrylate (or methacrylate).

The amount of surface active agent (F) used is preferably from 0.0001 to 2% by weight, and more preferably from 0.001 to 1% by weight, based on the total amount of the positive-working resist composition (excluding a solvent).

[6] (D) Solvent

The positive-working resist composition of the invention is prepared by dissolving the above-described components in a solvent. In the invention, the solvent means a solvent that is liquid under the conditions of 25° C. and 760 mmHg and has a boiling point of 250° C. or less.

With the positive-working resist composition of the invention, it is preferred to use a mixed solvent as solvent (D). Examples of such mixed solvent are those which contain at least one solvent of propylene glycol monoalkyl ether carboxylates (also referred to as "group A solvent"), at least one solvent of propylene glycol monoalkyl ethers, alkyl lactates and alkyl alkoxypropionates (also referred to as "group B solvent") and/or at least one solvent of γ-butyrolactone, ethylene carbonate, propylene carbonate and cyclohexanone (also referred to as "group C solvent"). Specifically, as the mixed solvent, a combination of a solvent of group A and a solvent of group B, a combination of a solvent of group A and a solvent of group C, and a combination of a solvent of group A, a solvent of group B and a solvent of group C may be used.

Preferred examples of propylene glycol monoalkyl ether carboxylate include propylene glycol monomethyl ether acetate, propylene glycol monomethyl ether propionate, propylene glycol monoethyl ether acetate and propylene glycol monoethyl ether propionate.

Preferred examples of propylene glycol monoalkyl ether include propylene glycol monomethyl ether and propylene glycol monoethyl ether. Preferred examples of alkyl lactate include methyl lactate and ethyl lactate. Preferred examples of alkyl alkoxypropionate include ethyl 3-ethoxypropionate, methyl 3-methoxypropionate, ethyl 3-methoxypropionate and methyl 3-ethoxypropionate.

The ratio by weight of the group A solvent to the group B solvent used (A:B) is preferably from 90:10 to 15:85, more preferably from 85:15 to 20:80, and still more preferably from 80:20 to 25:75.

The ratio by weight of the group A solvent to the group C solvent used (A:C) is preferably from 99.9:0.1 to 30:70, more preferably from 99:1 to 40:60, and still more preferably from 97:3 to 50:50.

In the case of combining three-group solvents, the ratio by weight of the group C solvent is preferably from 0.1 to 50% by weight, more preferably from 1 to 48% by weight, and still more preferably from 3 to 45% by weight, based on the total solvents.

In the invention, it is preferred to dissolve the components in the above-described mixed solvent so that the solid content of the composition containing the above-described components becomes preferably from 3 to 25% by weight, more preferably from 5 to 22% by weight, and still more preferably from 7 to 20% by weight.

Preferred examples of the mixed solvent for use in the invention containing propylene glycol monoalkyl ether carboxylate include:

propylene glycol monomethyl ether acetate+propylene glycol monomethyl ether;

propylene glycol monomethyl ether acetate+ethyl acetate;

propylene glycol monomethyl ether acetate+3-ethoxyethyl propionate;

propylene glycol monomethyl ether acetate+γ-butyrolactone;

propylene glycol monomethyl ether acetate+ethylene carbonate;

propylene glycol monomethyl ether acetate+propylene carbonate;

propylene glycol monomethyl ether acetate+cyclohexanone;

propylene glycol monomethyl ether acetate+propylene glycol monomethyl ether+γ-butyrolactone;

propylene glycol monomethyl ether acetate+ethyl lactate+γ-butyrolactone;

propylene glycol monomethyl ether acetate+3-ethoxyethyl propionate+γ-butyrolactone;

propylene glycol monomethyl ether acetate+propylene glycol monomethyl ether+ethylene carbonate;

propylene glycol monomethyl ether acetate+ethyl lactate+ethylene carbonate;

propylene glycol monomethyl ether acetate+3-ethoxyethyl propionate+ethylene carbonate;

propylene glycol monomethyl ether acetate+propylene glycol monomethyl ether+propylene carbonate;

propylene glycol monomethyl ether acetate+ethyl lactate+propylene carbonate;

propylene glycol monomethyl ether acetate+3-ethoxyethyl propionate+propylene carbonate; and propylene glycol monomethyl ether acetate+propylene glycol monomethyl ether+cyclohexanone.

Particularly preferred combinations of the solvents include:

propylene glycol monomethyl ether acetate+propylene glycol monomethyl ether;

propylene glycol monomethyl ether acetate+cyclohexanone;

propylene glycol monomethyl ether acetate+propylene glycol monomethyl ether+γ-butyrolactone;

propylene glycol monomethyl ether acetate+ethyl lactate+γ-butyrolactone;

propylene glycol monomethyl ether acetate+3-ethoxyethyl propionate+γ-butyrolactone;

propylene glycol monomethyl ether acetate+propylene glycol monomethyl ether+ethylene carbonate;

propylene glycol monomethyl ether acetate+ethyl lactate+ethylene carbonate;

propylene glycol monomethyl ether acetate+3-ethoxyethyl propionate+ethylene carbonate;

propylene glycol monomethyl ether acetate+propylene glycol monomethyl ether+propylene carbonate;

propylene glycol monomethyl ether acetate+ethyl lactate+propylene carbonate;

propylene glycol monomethyl ether acetate+3-ethoxyethyl propionate+propylene carbonate; and propylene glycol monomethyl ether acetate+propylene glycol monomethyl ether+cyclohexanone.

To the mixed solvent may be added other solvent. Such other solvent may be added in an amount of ordinarily 30 parts by weight or less per 100 parts by weight of the mixed solvent of the invention. Examples of the other solvent include ethylene dichloride, cyclopentanone, methyl ethyl ketone, toluene, N,N-dimethylformamide, dimethylsulfoxide, N-methylpyrrolidone and tetrahydrofuran.

It is preferred to use the mixed solvent for the positive-working resist composition of the invention but, if desired, a solvent, for example, propylene glycol monomethyl ether acetate, propylene glycol monomethyl ether and cyclohexanone may be used as a single solvent.

The positive-working resist composition of the invention may contain, if desired, a low-molecular, acid-decomposable compound having a molecular weight of 2,000 or less, having a group capable of being decomposed by the action of an acid and increasing a solubility in alkali by the action of an acid.

For example, alicyclic compounds having an acid decomposable group, for example, a cholic acid derivative, a dehydrocholic acid derivative, deoxycholic acid derivative, a lithocholic acid derivative, an ursocholic acid derivative and an abietic acid derivative as described in *Proc. of SPIE*, 2724, 355 (1966), JP-A-8-15865, U.S. Pat. Nos. 5,310,619 and 5,372,912, *J. Photopolym. Sci., Tech.*, Vol. 10, No. 3, 511(1997) and aromatic compounds such as a naphthalene derivative having an acid-decomposable group may be used as the low-molecular, acid-decomposable compound.

Further, low-molecular, acid-decomposable, dissolution inhibiting compounds described in JP-A-6-51519 can be used in an amount not deteriorating transmittance at 220 nm, and 1,2-naphthoquinonediazide compounds may also be used.

In the case of using the low-molecular, acid-decomposable, dissolution inhibiting compound in the resist composition of the invention, the content thereof is ordinarily from 0.5 to 50 parts by weight, preferably from 0.5 to 40 parts by weight, still more preferably from 0.5 to 30 parts by weight, and particularly preferably from 0.5 to 20.0 parts by weight, based on 100 parts by weight of the resist composition (solid content).

Addition of the low-molecular, acid-decomposable, dissolution inhibiting compound serves to further improve the aforesaid development defect and improve dry etching resistance.

In the positive-working resist composition of the invention may further be incorporated, if desired, a compound for promoting dissolution in a developing solution, an antihalation compound, a plasticizer, a surface active agent, a photosensitizer, an adhesive, a cross-linking agent, a photo base generator, etc.

Examples of the compound for promoting dissolution in a developing solution for use in the invention include low-molecular compounds having a molecular weight of 1,000 or less, for example, compounds having two or more phenolic hydroxyl groups described in JP-A-3-206458, naphthols such as 1-naphthol, compounds having one or more carboxyl groups, carboxylic acid anhydrides, sulfonamide compounds and sulfonylimide compounds.

The amount of the compound for promoting dissolution in a developing solution is preferably 30% by weight or less, and more preferably 20% by weight or less, based on the total amount of the composition (solid content).

Preferred examples of the antihalation agent include compounds capable of well absorbing irradiated radiation, for example, substituted benzenes such as fluorene, 9-fluorenone and benzophenone; and polycyclic aromatic compounds such as anthracene, anthracene-9-methanol, anthracene-9-carboxyethyl, phenanthrene, perylene and azirene. Of these, polycyclic aromatic compounds are particularly preferred. The antihalation agent functions to decrease reflected light from a substrate and reduce influence of multi-reflection within a resist film, thus removing standing wave problem.

Also, a photosensitizer may be added to the composition for improving acid-generating efficiency. Preferred examples of the photosensitizer include benzophenone, p,p'-tetramethyldiaminobenzophenone, 2-chlorothioxanthone, anthrone, 9-ethoxyanthracene, pyrene, phenothiazine, benzyl, benzoflavin, acetophenone, phenanthrene, benzoquinone, anthraquinone and 1,2-naphthoquinone, but the invention should not be construed as being limited thereto. The photosensitizer may also be used as the antihalation agent.

<<Method for Use>>

The positive-working resist composition of the invention is applied onto a desired substrate in the following manner after dissolving the components in a solvent and filtering the solution through a filter.

Specifically, the composition is applied to a substrate (e.g., silicon/silicon dioxide coating) as used for the production of a precise integrated circuit device by appropriate application means, for example, spinner or coater, then heated to form a resist film.

Then, the resulting photosensitive layer is exposed to light through a desired mask, followed by heating and development. Thus, good resist patterns are obtained. As the light for exposure, a far ultraviolet ray having preferably a wavelength of 250 nm or shorter, more preferably 220 nm or shorter is used. Specific examples thereof include KrF excimer laser (248 nm), ArF excimer laser (193 nm), F2 excimer laser (157 nm), X-ray and electron beam.

As the alkali developing solution for the positive-working resist composition of the invention, an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine may be used.

A developing solution prepared by adding an appropriate amount of an alcohol or a surface active agent to the aqueous alkaline solution may also be used.

The alkali concentration of the alkali developing solution is ordinarily from 0.1 to 20% by weight.

The pH of the alkali developing solution is ordinarily from 10.0 to 15.0.

The present invention is described in more detail with reference to the following examples, but the invention should not be construed as being limited thereto.

SYNTHESIS EXAMPLE (1)

SYNTHESIS OF RESIN (1)

2-Ethyl-2-adamantyl methacrylate and butyrolactone methacrylate were charged in a ratio of 55/45 (mole ratio) and dissolved in a mixed solvent of methyl ethyl ketone and tetrahydrofuran (5/5) to prepare 100 ml of a solution having a solid concentration of 20% by weight. To the solution was added 2% by mole of a polymerization initiator of V-65 manufactured by Wako Pure Chemical Industries, Ltd., and the solution was added dropwise to 10 ml of methyl ethyl ketone heated at 60° C. under a nitrogen gas stream over a period of 4 hours. After the completion of the dropwise addition, the reaction solution was heated for 4 hours and 1% by mole of V-65 was again added thereto, followed by stirring for 4 hours. After the completion of the reaction, the reaction solution was cooled to room temperature and poured into 3 liters of a mixed solvent of distilled water and isopropyl alcohol (1/1 by weight) to crystallize, and the white powder deposited was recovered to obtain Resin (1).

A monomer unit composition ratio of the resin determined by $C^{13}$NMR was 46/54. A weight average molecular weight thereof measured by GPC method and calculated in terms of standard polystyrene was 10,700.

Resins (2) to (12) were synthesized in a similar manner to Synthesis Example (1) respectively. The monomer unit composition ratio and weight average molecular weight of each of Resins (2) to (10) are shown below. Repeating Units 1, 2, 3 and 4 denote the repeating units of Resins (2) to (10) shown below in order from left to right, respectively.

TABLE 1

| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| 2 | 42 | 31 | 27 | — | 8,300 |
| 3 | 42 | 30 | 28 | — | 10,300 |
| 4 | 39 | 35 | 26 | — | 8,900 |
| 5 | 46 | 22 | 30 | 2 | 12,900 |
| 6 | 38 | 32 | 30 | — | 11,300 |
| 7 | 50 | 20 | 20 | 10 | 11,500 |
| 8 | 40 | 40 | 20 | — | 12,300 |
| 9 | 40 | 40 | 20 | — | 11,300 |
| 10 | 30 | 30 | 10 | 30 | 11,500 |

Structures of Resins (1) to (10) are shown below.

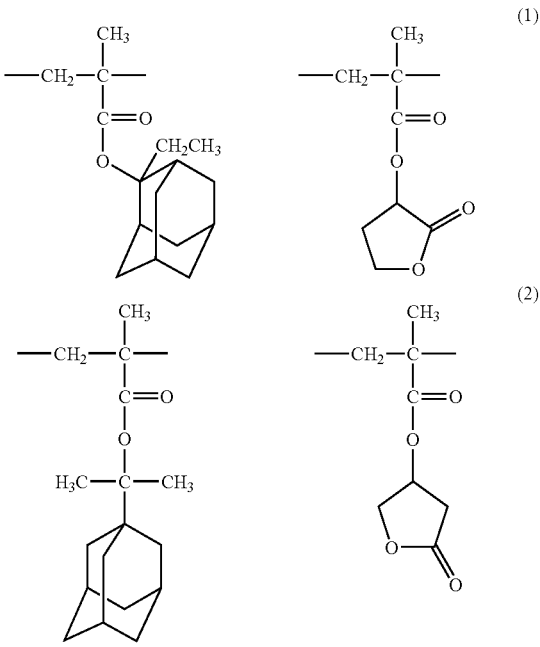

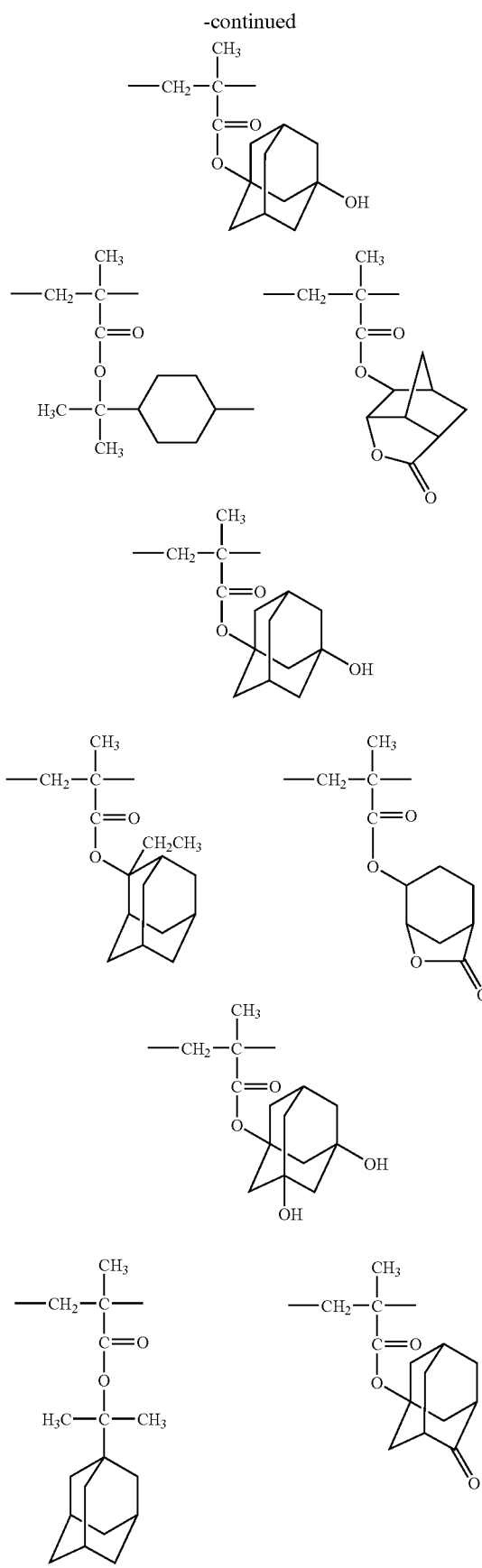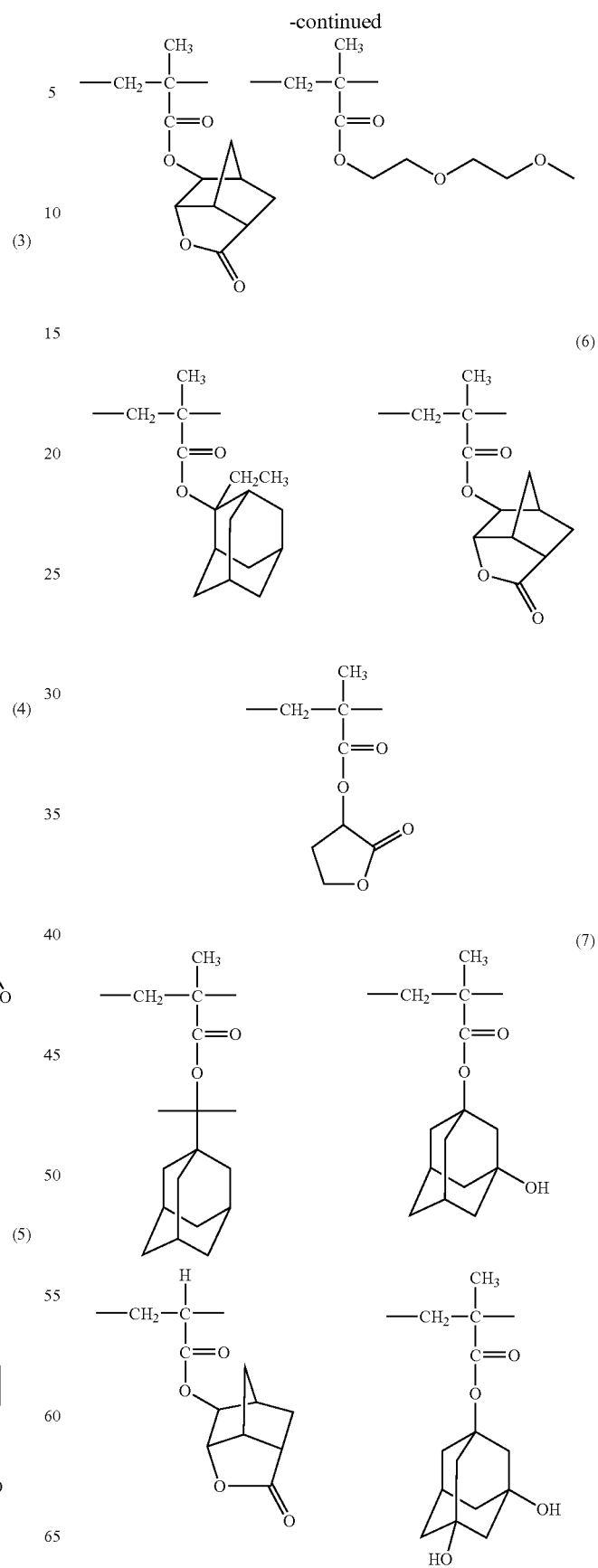

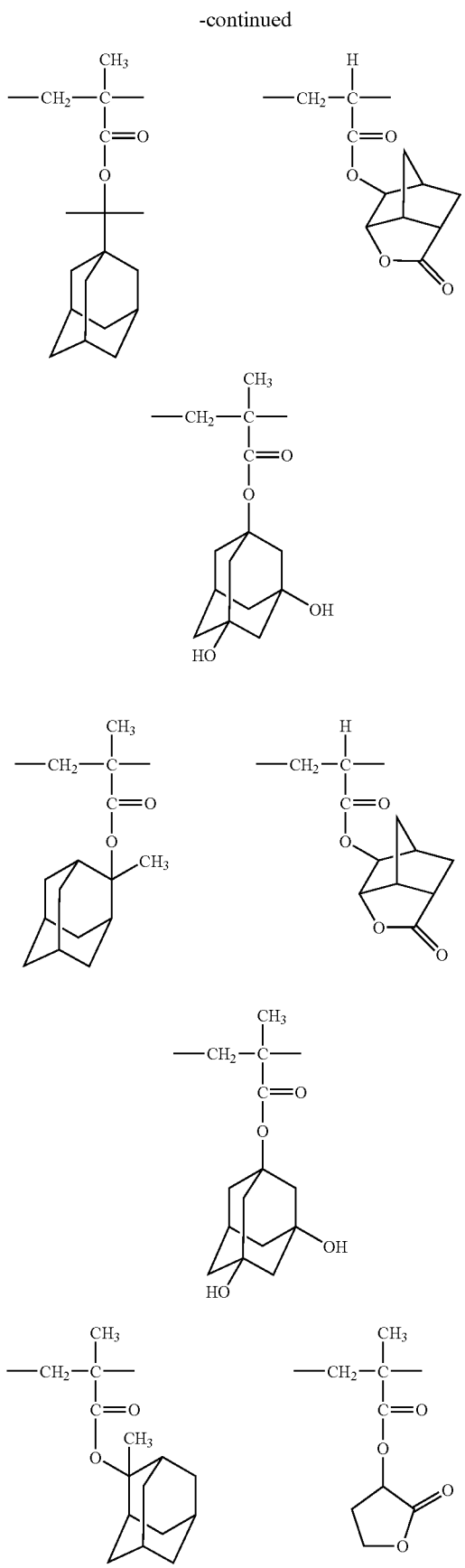
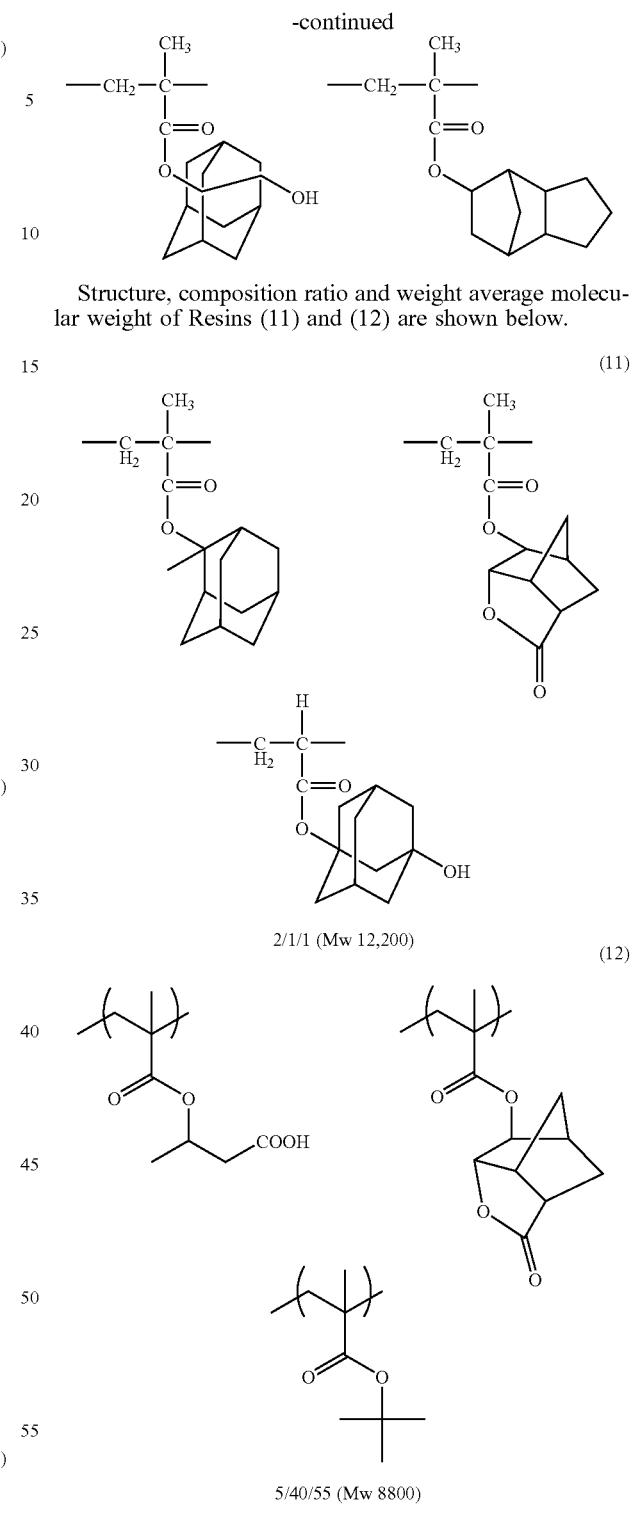
Structure, composition ratio and weight average molecular weight of Resins (11) and (12) are shown below.
EXAMPLES 1 TO 14 AND COMPARATIVE EXAMPLES 1 TO 6
(Preparation and Evaluation of Positive-Working Resist Composition)
In each of Examples 1 to 14 and Comparative Examples 1 to 6, 1.03 g of a resin, 0.00035 mol of an acid generator, 16.5 mg of a compound of Component (C), 1.65 mg of a nitrogen-containing basic compound and 100 ppm based on the total amount, of a surface active agent were blended as shown in Tables 2 to 3 and, after dissolving in a solvent shown in Tables 2 to 3 to prepare a solution having a solid concentration of 11% by weight, the resulting solution was filtered through a microfilter having a pore size of 0.1 μm, whereby a positive-working resist composition was prepared.

TABLE 2

| Example | Resin | Acid Generator (Molar Ratio) | Compound of Component (C) | Melting Point (° C.) of Compound of Component (C) | Boiling Point (° C.) of Compound of Component (C) | Nitrogen-Containing Basic Compound | Surface Active Agent |
|---|---|---|---|---|---|---|---|
| 1 | (8) | PAGII-7/PAG5-3 (1/5) | (C-1) | 35-38 | 193-195* | N-1 | W-1 |
| 2 | (11) | PAGII-7 | (C-7) | 256-258 | | N-2 | W-1 |
| 3 | (9) | PAGII-1/PAGII-7 (1/3) | (C-3) | 77-78.5 | | N-3 | W-1 |
| 4 | (10) | PAGII-1 | (C-10) | 94-96 | 168-172* 57.0** | N-4 | W-1 |
| 5 | (8) | PAGII-6 | (C-68) | 219-222 | | N-5 | W-1 |
| 6 | (4) | PAGII-7/PAG4-5 (4/1) | (C-63) | 78-80 | | N-6 | W-2 |
| 7 | (9) | PAGII-8 | (C-14) | 200 | | N-7 | W-2 |
| 8 | (11) | PAGII-9 | (C-12) | 179-181 | | N-5 | W-1 |
| 9 | (2) | PAGII-7 | (C-13) | 200-203 | | N-6 | — |
| 10 | (10) | PAGII-2 | (C-74) | 59-63 | 208-210* | N-7 | W-2 |

| Example | Solvent (Ratio by weight) | Pattern Collapse (nm) | PED Stability (%) | Line Edge Roughness (nm) | Profile | Sensitivity (mJ/cm$^2$) | Resolution (μm) |
|---|---|---|---|---|---|---|---|
| 1 | S-1/S-5 (3/2) | 75 | 1.0 | 6.5 | ○ | 42.0 | 0.100 |
| 2 | S-1/S-5 (3/2) | 73 | 1.3 | 6.8 | ○ | 40.0 | 0.105 |
| 3 | S-1/S-5 (3/2) | 73 | 1.3 | 6.9 | ○ | 39.5 | 0.100 |
| 4 | S-1/S-5/S-2 (3/1/3) | 76 | 2.6 | 7.6 | ○ | 38.5 | 0.105 |
| 5 | S-1/S-5 (3/2) | 75 | 1.0 | 6.5 | ○ | 43.0 | 0.100 |
| 6 | S-5 | 73 | 1.3 | 7.8 | Δ | 40.0 | 0.105 |
| 7 | S-1/S-5 (1/1) | 74 | 3.3 | 6.9 | ○ | 39.5 | 0.105 |
| 8 | S-1/S-2 (2/3) | 76 | 2.6 | 7.6 | ○ | 42.5 | 0.105 |
| 9 | S-1/S-7 (20/1) | 77 | 1.3 | 6.8 | ○ | 43.5 | 0.100 |
| 10 | S-1/S-9 (20/1) | 90 | 2.6 | 7.6 | Δ | 42.5 | 0.105 |

*boiling point under 760 mmHg
**boiling point under 10 mmHg

TABLE 3

| Example | Resin | Acid Generator (Molar Ratio) | Compound of Component (C) | Melting Point (° C.) of Compound of Component (C) | Boiling Point (° C.) of Compound of Component (C) | Nitrogen-containing Basic Compound | Surface Active Agent |
|---|---|---|---|---|---|---|---|
| 11 | (8) | PAGII-7 | (C-72) | 53-55 | | N-2 | W-1 |
| 12 | (5) | PAGII-3 | (C-26) | 240-242 | | — | W-1 |
| 13 | (11) | PAGII-7 | (C-122) | 24 | 104-106** | N-1 | W-1 |
| 14 | (8) | PAGII-7 | (C-78) | 105-107 | | N-1 | W-1 |
| Comparative Example 1 | (8) | PAGII-1 | 2-Octane | −16 | 173-174* 60.9** | N-5 | W-1 |
| Comparative Example 2 | (11) | PAGII-1 | 2-eptanone | −35 | 149-150* 55.5** | N-5 | W-1 |
| Comparative Example 3 | (11) | PAGII-1 | Cyclo-hexanone | −45 | 155-156* 38.7** | N-5 | W-1 |
| Comparative Example 4 | (11) | PAGII-1 | 3-Octanone | | 167-168* 50.5** | N-5 | W-1 |

TABLE 3-continued

| Example | | | | | | | | |
|---|---|---|---|---|---|---|---|---|
| Comparative Example 5 | (9) | PAGII-1 | — | | | | N-5 | W-1 |
| Comparative Example 6 | (12) | PAGII-1 | — | | | | — | W-1 |

| Example | Solvent (Ratio by weight) | Pattern Collapse (nm) | PED Stability (%) | Line Edge Roughness (nm) | Profile | Sensitivity (mJ/cm$^2$) | Resolution (µm) |
|---|---|---|---|---|---|---|---|
| 11 | S-1/S-5 (2/3) | 90 | 2.6 | 8.7 | Δ | 42.5 | 0.105 |
| 12 | S-3 (3/2) | 75 | 3.8 | 8.9 | Δ | 29.0 | 0.110 |
| 13 | S-1/S-5 (2/3) | 84 | 2.0 | 7.9 | Δ | 39.5 | 0.105 |
| 14 | S-1/S-5 (3/2) | 74 | 1.1 | 6.5 | ○ | 38.0 | 0.100 |
| Comparative Example 1 | S-1 | 110 | 6.0 | 11.5 | x | 62.0 | 0.115 |
| Comparative Example 2 | S-1/S-7 (20/1) | 110 | 5.3 | 10.2 | x | 56.5 | 0.115 |
| Comparative Example 3 | S-1/S-7 (20/1) | 108 | 5.3 | 10.3 | x | 56.0 | 0.115 |
| Comparative Example 4 | S-1/S-7 (20/1) | 118 | 6.0 | 10.2 | x | 55.5 | 0.115 |
| Comparative Example 5 | S-1/S-7 (20/1) | 120 | 6.7 | 11.5 | x | 62.5 | 0.120 |
| Comparative Example 6 | S-1/S-7 (20/1) | 120 | 6.5 | 11.3 | x | 50.0 | 0.120 |

*boiling point under 760 mmHg
**boiling point under 10 mmHg

The abbreviations on the Nitrogen-containing basic compounds are as follows.
N-1: 1,5-Diazabicyclo[4.3.0]-5-nonene
N-2: 1,8-Diazabicyclo[5.4.0]-7-undecene
N-3: 4-Dimethylaminopyridine
N-4: Triphenylimidazole
N-5: Diisopropylaniline
N-6: Tributylamine
N-7: Trioctylamine The abbreviations on the surface active agents are as follows.

W-1: Megafac F176 (manufactured by Dainippon Ink and Chemicals, Inc.)(fluorine-base)

W-2: Megafac R08 (manufactured by Dainippon Ink and Chemicals, Inc.)(fluorine- and silicon-base)

W-3: Polysiloxane polymer KP-341 (manufactured by Shin-Etsu Chemical Co., Ltd.)

W-4: Troysol S-366 (manufactured by Troy Chemical Co., Ltd.)

The abbreviations on the solvents are as follows.

S-1: Propylene glycol monomethyl ether acetate

S-2: Ethyl lactate

S-3: Butyl acetate

S-4: 2-Heptanone

S-5: Propylene glycol monomethyl ether

S-6: Ethyl ethoxypropionate

S-7: γ-Butyrolactone

S-8: Ethylene carbonate

S-9: Propylenje carbonate

S-10: Cyclohexanone (1) Evaluation of Profile

On a silicon substrate which had been subjected to a hexamethyldisilazane treatment was uniformly coated an antireflective coating DUV-42 manufactured by Brewer Science, Inc. in a thickness of 600 angstroms by a spin coater, dried at 100° C. for 90 seconds on a hot plate, and further dried by heating at 190° C. for 240 seconds. Thereafter, each of the positive-working resist compositions was coated thereon by a spin coater and dried at 120° C. for 90 seconds to form a resist film having a thickness of 0.30 µm. The resist film was subjected to exposure using an ArF excimer laser stepper (manufactured by ISI Co., Ltd.; NA=0.60, 0.60/0.80 annular) through a mask and heated at 120° C. for 90 seconds on a hot plate immediately after the exposure. Then, the resist film was developed with a 2.38% by weight aqueous tetramethylammonium hydroxide solution at 23° C. for 60 seconds, rinsed with pure water for 30 seconds, and dried to obtain a line pattern.

Profile of the line and space (1/1) pattern of 0.13 µm was observed under a scanning microscope. A rectangular profile was evaluated as "O", a somewhat round-topped profile as "Δ", and a round-topped profile as "x"

(2) Evaluation of Sensitivity and Resolution

The sensitivity was expressed by an exposure amount necessary for reproducing a line and space (1/1) pattern of 0.13 µm.

Also, the minimum dimension (µm) of a resist pattern resolved when exposed at this exposure amount was taken as resolution.

(3) Evaluation of Line Edge Roughness

A distance from the standard line where the edge should be present to the edge of the 0.13-µm line pattern obtained by exposing in the maximum exposure amount for reproducing the line and space (1/1) pattern of 0.13 µm, was measured in 50 points in the area of a length of 5 µm in the longitudinal direction using a critical dimension scanning electron microscope (S-8840, manufactured by Hitachi, Ltd.), standard deviation was determined, and 3σ was calculated. The smaller the value, the better the quality.

(4) Evaluation of Prevention of Pattern Collapse

A line and space (1:1) mask pattern having a series of 15 lines was used for the evaluation. The exposure conditions were same as those in the evaluation of profile. Measurement of line width was started with a sample exposed in an exposure amount capable of reproducing the line and space (1:1) pattern of 0.13 μm, and an exposure amount at which at least one line of the central 5 lines collapsed was determined while changing the exposure amount. This point was taken as the point where pattern collapse initiated. The line width immediately before the pattern collapse (limit where the central 5 lines remained without collapse) was used as a limit line width for the pattern collapse.

(5) Evaluation of PED Stability

A resist film formed by coating and baking the positive-working resist composition was irradiated in an irradiation amount enough to form a line and space pattern of 0.13 μm as designed (for example, ArF excimer laser: 14 mJ/cm$^2$; or EB: 10 μC/cm$^2$), and the irradiated wafer was left for 2 hours in a clean room. Subsequently, the wafer was baked and developed. Deviation from designed dimension of the 0.13-μm line and space pattern was measured.

[Designed dimension−Actual dimension]/Designed dimension×100 (%)

The smaller the value, the better the quality.

The results of the evaluation are shown in Tables 2 and 3.

It is apparent from Tables 2 and 3 that the positive-working resist composition of the invention prevents pattern collapse in the formation of fine pattern and improves PED stability, line edge roughness, profile, sensitivity and resolution.

The present invention provides a positive-working resist composition which prevents pattern collapse in the formation of a fine pattern and improves PED stability, line edge roughness, profile, sensitivity and resolution.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive-working resist composition comprising (A) a resin that increases solubility in an alkali developing solution by the action of an acid, (B) a compound which generates an acid upon irradiation of an actinic ray or radiation, (C) a nonionic cyclic compound having at least one partial structure represented by the following formula (I) or (II) and at least having either a melting point of 35° C. or more or a boiling point of 100° C./10 mmHg or more:

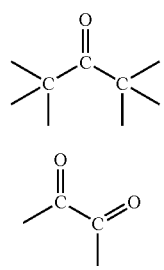

and (D) a solvent.

2. The positive-working resist composition as claimed in claim 1, wherein the component (C) of the nonionic cyclic compound has an alicyclic structure or a bridged alicyclic structure, and at least one ring constituting the alicyclic structure or bridged alicyclic structure has at least one partial structure represented by the formula (I) or (II).

3. The positive-working resist composition as claimed in claim 2, wherein the (C) component of the nonionic cyclic compound has a bridged alicyclic structure and does not have a benzene ring.

4. The positive-working resist composition as claimed in claim 1, wherein the nonionic cyclic compound of the component (C) has two or more partial structures represented by the formula (I) and does not have a benzene ring.

5. The positive-working resist composition as claimed in claim 1, wherein the nonionic cyclic compound of the component (C) has at least one partial structure represented by the above formula (II) and does not have a benzene ring.

6. The positive-working resist composition as claimed in claim 1, which further comprises (E) a nitrogen-containing basic compound.

7. The positive-working resist composition as claimed in claim 1, wherein atoms constituting the nonionic cyclic compound of the component (C) comprise only carbon atoms and hydrogen atoms except for the partial structure represented by the formula (I) or (II).

8. The positive-working resist composition as claimed in claim 1, wherein the resin of the component (A) has an alicyclic structure or a bridged alicyclic structure.

9. The positive-working resist composition as claimed in claim 8, wherein the resin of the component (A) is a resin having an alkali-soluble group protected with a 2-alkyl-2-adamantyl group or a 1-adamantyl-1-alkylalkyl group.

10. The positive-working resist composition as claimed in claim 8, wherein the resin of the component (A) further has a repeating unit represented by the following formula (III):

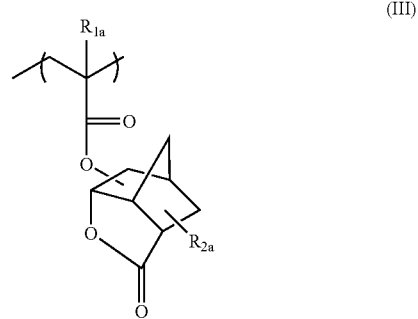

wherein, $R_{1a}$ represents a hydrogen atom, an alkyl group or a halogen atom, and $R_{2a}$ represents a hydrogen atom or an alkyl group.

11. The positive-working resist composition as claimed in claim 8, wherein the bridged alicyclic structure in the resin of the component (A) is dihydroxyadamantane.

* * * * *